(12) United States Patent
Guglielmo et al.

(10) Patent No.: US 11,030,354 B2
(45) Date of Patent: *Jun. 8, 2021

(54) TIME-SAVING AND ERROR-MINIMIZING MULTISCOPIC HYDRAULIC SYSTEM DESIGN CANVAS

(71) Applicant: Enovation Controls, LLC, Tulsa, OK (US)

(72) Inventors: Kennon Guglielmo, San Antonio, TX (US); Eric Peterson, San Antonio, TX (US); Doug Conyers, San Antonio, TX (US)

(73) Assignee: Enovation Controls, LLC, Tulsa, OK (US)

( * ) Notice: Subject to any disclaimer, the term of this patent is extended or adjusted under 35 U.S.C. 154(b) by 77 days.

This patent is subject to a terminal disclaimer.

(21) Appl. No.: 16/535,775

(22) Filed: Aug. 8, 2019

(65) Prior Publication Data

US 2019/0362031 A1    Nov. 28, 2019

Related U.S. Application Data

(63) Continuation of application No. 14/566,703, filed on Dec. 10, 2014, now Pat. No. 10,402,504.

(60) Provisional application No. 61/914,087, filed on Dec. 10, 2013.

(51) Int. Cl.
*G06F 17/00* (2019.01)
*G06F 30/00* (2020.01)
*E02B 1/02* (2006.01)

(52) U.S. Cl.
CPC ............... *G06F 30/00* (2020.01); *E02B 1/02* (2013.01)

(58) Field of Classification Search
CPC .. G06F 17/50; G06F 17/30864; G06F 3/0481; H04L 29/06; H04L 29/08072
USPC ..................... 703/1; 707/705; 709/217, 219; 715/700, 733
See application file for complete search history.

(56) References Cited

U.S. PATENT DOCUMENTS

| | | | | |
|---|---|---|---|---|
| 2002/0092004 A1* | 7/2002 | Lee | ........................ | G06F 8/00 717/140 |
| 2004/0205075 A1* | 10/2004 | LaTurner | ............... | G06Q 10/10 |
| 2012/0010739 A1* | 1/2012 | Elisma | .................... | G06F 30/00 700/98 |

* cited by examiner

*Primary Examiner* — Andy Ho
(74) *Attorney, Agent, or Firm* — McDonnell Boehnen Hulbert & Berghoff LLP

(57) ABSTRACT

An automated design system for facilitating intelligent design of electromechanically controlled hydraulic systems. The automated design system utilizes one or more servers and one or more processors for accessing design information related to the hydraulic systems. The design system also includes a display device which provides an interface, an input device and a software program which allow a user to select various design characteristics related to a product design. The automated design system also provides text-based and graphical outputs pertaining to a product design.

17 Claims, 24 Drawing Sheets

50

| File | Edit | | Evaluate | Generate Derivatives |
|---|---|---|---|---|
| New | Functional Component | ▷ | Check Errors | Bill of Materials |
| Existing | Connection | ▷ | | Assembly Drawings |
| Save | Copy | | | Wiring Diagrams |
| | Paste | | | Work Instructions |
| | Cut | | | Routings |
| | | | | QC Instructions |

| File | Edit | | Evaluate | Generate Derivatives | |
|---|---|---|---|---|---|
| | Functional Component | ▷ | Processors | | ▷ |
| | Connection | ▷ | Actuators | | ▷ |
| | Copy | | Transducers | | ▷ |
| | Paste | | | | ▷ |
| | Cut | | Custom Functional Component | | ▷ |

| File | Edit | | Evaluate | Generate Derivatives |
|------|------|---|----------|----------------------|
| | Functional Component ▷ | | Processors | ▷ |
| | Connection | Processor | Clock Speed | Cache |
| | Copy | 1 | 3.0 GHz | 8 MB |
| | Paste | 2 | 2.4 GHz | 16 MB |
| | Cut | 3 | 3.2 GHz | 8 MB |

| File | Edit | Evaluate | Generate Derivatives |
|------|------|----------|----------------------|
| | Functional Component ▷ Actuators | | ▷ |
| Actuator Number | Load | Stroke | Voltage |
| 1 | 450 lbs | 3.00 in | 110 |
| 2 | 225 lbs | 6.00 in | 110 |
| 3 | 100 lbs | 2.00 in | 110 |

54

Fig. 3D

TIME-SAVING AND ERROR-MINIMIZING MULTISCOPIC HYDRAULIC SYSTEM DESIGN CANVAS

CROSS-REFERENCE TO RELATED PATENT APPLICATIONS

This application is a continuation of prior filed co-pending U.S. Non-Provisional patent application Ser. No. 14/566,703, filed on Dec. 10, 2014, which claims the benefit of the filing date of U.S. Provisional Application Ser. No. 61/914,087, filed on Dec. 10, 2013. The entire disclosures, including the claims and drawings, of U.S. Non-Provisional patent application Ser. No. 14/566,703 and U.S. Provisional Application Ser. No. 61/914,087, are incorporated by reference into the present disclosure as if set forth in their entirety.

BACKGROUND

Field of the Invention

Many aspects of the present invention relate generally to the field of automated systems for facilitating engineered electromechanical design and, more particularly, to software and related methods and systems for facilitating intelligent design and generation of design, production and use documentation for hydraulic machinery.

Background History

Hydraulic machinery likely has origins since prehistoric times, and electromechanically controlled hydraulic machinery has been fundamental in a vast array of industries for many years. And, naturally, effective approaches for designing such systems are as ancient as the machines themselves.

Despite such vast history, the state of the art for designing electromechanically controlled hydraulic machinery is complicated and time consuming and requires expert input from no less than three different technical disciplines. The inherent complexity in turn makes the design process not only costly but also subject to numerous opportunities for human error, which are further compounded due to the multidisciplined input and design choices. Not only is each facet of the process complex on its own, extra effort is always needed to coordinate and manage all facets of the process. As a result, even though most hydraulic systems are designed largely if not entirely from off-the-shelf parts, the process of designing modern electromechanically controlled hydraulic machinery collectively requires several man-weeks of effort for even simple systems.

Accordingly, a serious need remains for more efficient yet reliable systems for designing electromechanically controlled hydraulic machinery. Related needs also include the long-felt need to minimize the inherent complexity of the design process to the point of enabling a single designer to start and finish a comprehensive hydraulic design effort with less uncertainty and risk of error, while still producing affordable, efficiently-designed hydraulic systems.

Some of the more basic objectives of the present inventions are to improve over the prior art and to enable better systems for designing electromechanically controlled hydraulic machinery, particularly in ways that save time and money and that reduce errors as well as the need for extensive effort in validating the resulting designs. Many other problems, deficiencies, disadvantages, obstacles, unmet needs, and challenges of the prior art will be evident to those of skill in the art, particularly to those of skill in the field of hydraulic system integration and design.

Secondary objectives of the present inventions include the provision of a comprehensive system for quickly coordinating and resolving design requirements and limitations from multiple technical disciplines. A related objective of variations of the present inventions is to facilitate the provision of the best and/or most helpful system for coordinating and balancing the potentially conflicting needs of the process of designing electromechanically controlled hydraulic machinery.

Objectives of some variations of the present invention also include overcoming the various kinds of limitations, obstacles and challenges of the prior art in ways that help optimize efficiency and effectiveness. Related objectives include effectively addressing the needs while minimizing the costs of both the design process as well as the ultimate product, especially in ways that can be easily implemented, easily structured, and easily used in each instance. Many other objectives will be evident to those of skill in the pertinent arts.

SUMMARY OF THE INVENTION

While it would be an incredible dream for a single solution to address all the referenced objectives within the field of hydraulic machinery design, many of those objectives are preferably met, in whole or in part, by one or more variations of the present invention, according to which a system or method are provided for efficiently and effectively designing electromechanically controlled hydraulic machines.

Aspects of the present inventions are expected to be generally defined in appended claims, as they may be added, supplemented, clarified or amended from time to time. However, those of skill in the art will recognize many other aspects and variations of the inventions from the following more detailed descriptions of preferred embodiments, especially when considered in light of the prior art. It must be understood that many other aspects of the inventions and many other alternatives, variations, substitutions and modifications will also fall within the scope of the inventions, both those inventions that are now claimed, as well as those inventions that are described but not yet claimed.

BRIEF DESCRIPTION OF THE DRAWINGS

FIGS. 3A-3F are partial screen shots showing various alternative menu selections carried out by a user while designing an electromechanical system according to the preferred system of the present invention. As various selections are made from the drop-down menus shown, elements are added to the design canvas as shown in FIG. 2A.

DETAILED DESCRIPTION OF THE ILLUSTRATED EMBODIMENTS

The disclosures of this patent application, including the descriptions, drawings, and claims, describe one or more embodiments of the invention in more detail. Many other features, objects, and advantages of the invention will be apparent from these disclosures to one of ordinary skill in the art, especially when considered in light of a more exhaustive understanding of the numerous difficulties and challenges faced by the art. While there are many alternative variations, modifications and substitutions within the scope of the invention, one of ordinary skill in the art should consider the scope of the invention from a review of any claims that may be appended to applications and patents based hereon (including any amendments made to those claims in the course of prosecuting this and related applications).

Figure 1:
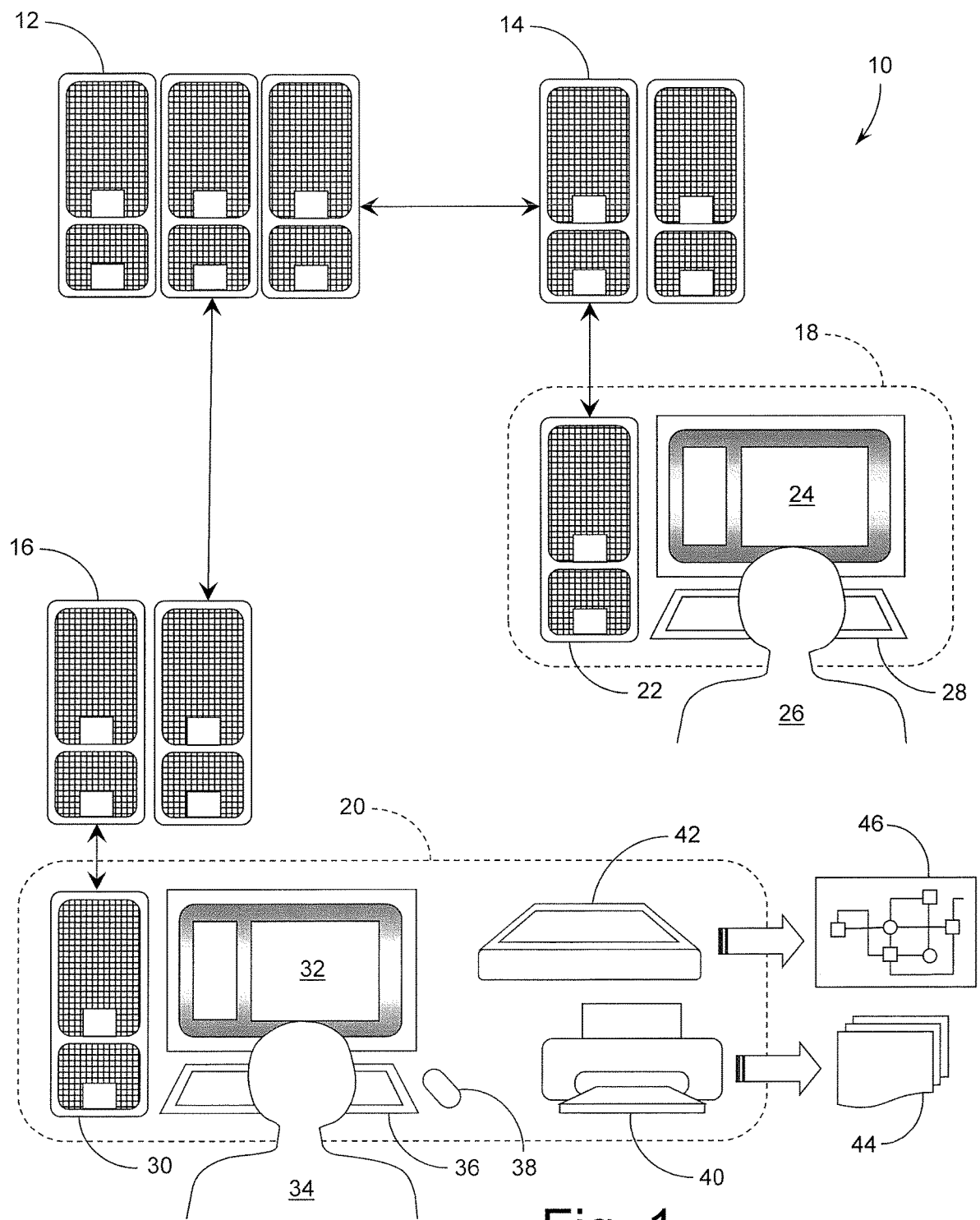
FIG. 1 is a schematic diagram showing an overview of a preferred system for implementing the present invention.

FIG. 1 provides an overview of the processing hardware, database servers, network connections, and I/O devices associated with a system for implementing the methods of the present invention. System 10 generally operates from a main server 12 that is connected to a database server 14 and one or more local servers 16. Database server 14 is provided for building and storing information regarding the various components, connections, and operational parameters associated with the various elements of the product system being designed and constructed. These databases built within database server 14 are generated by individuals entering data associated with the various components, their characteristics, and connectability. This initial (and ongoing) background data input is carried out at data input station 18 with local processor 22 operating through display system 24. Data input operator 26 produces the data base elements (templates and information) using user input devices 28, such as a computer keyboard and/or a pointing device.

Database server 14 provides access to the stored templates and component data to main server 12. In a preferred embodiment, main server 12 may be a networked server for a specific facility or may be present on the cloud for access from a number of connected (networked) locations. Those skilled in the art will recognize that main server 12, with access to database server 14, may provide access to any of a number of local servers and work stations for providing local and/or remote use of the system of the present invention.

Local server 16, provided as an example, is connected to main server 12 and thereby provides access not only to the operational application software for the system but also the stored templates and information in database server 14. User work station 20 provides the necessary hardware for carrying out the full functionality of the overall system of the present invention. Work station 20 includes local processor 30 connected to local server 16. Operational user 34 utilizes display device 32 as well as user data input keyboard 36 and pointing device 38. Also associated with work station 20 are printer output systems, preferably a standard printer 40 and optionally a larger graphics plotting printer 42. Printer 40 provides as output most of the text-based deliverables 44 of the system of the present invention, while graphics plotting printer 42 provides diagrams and schematics 46 as output deliverables of the system.

Figure 2A:
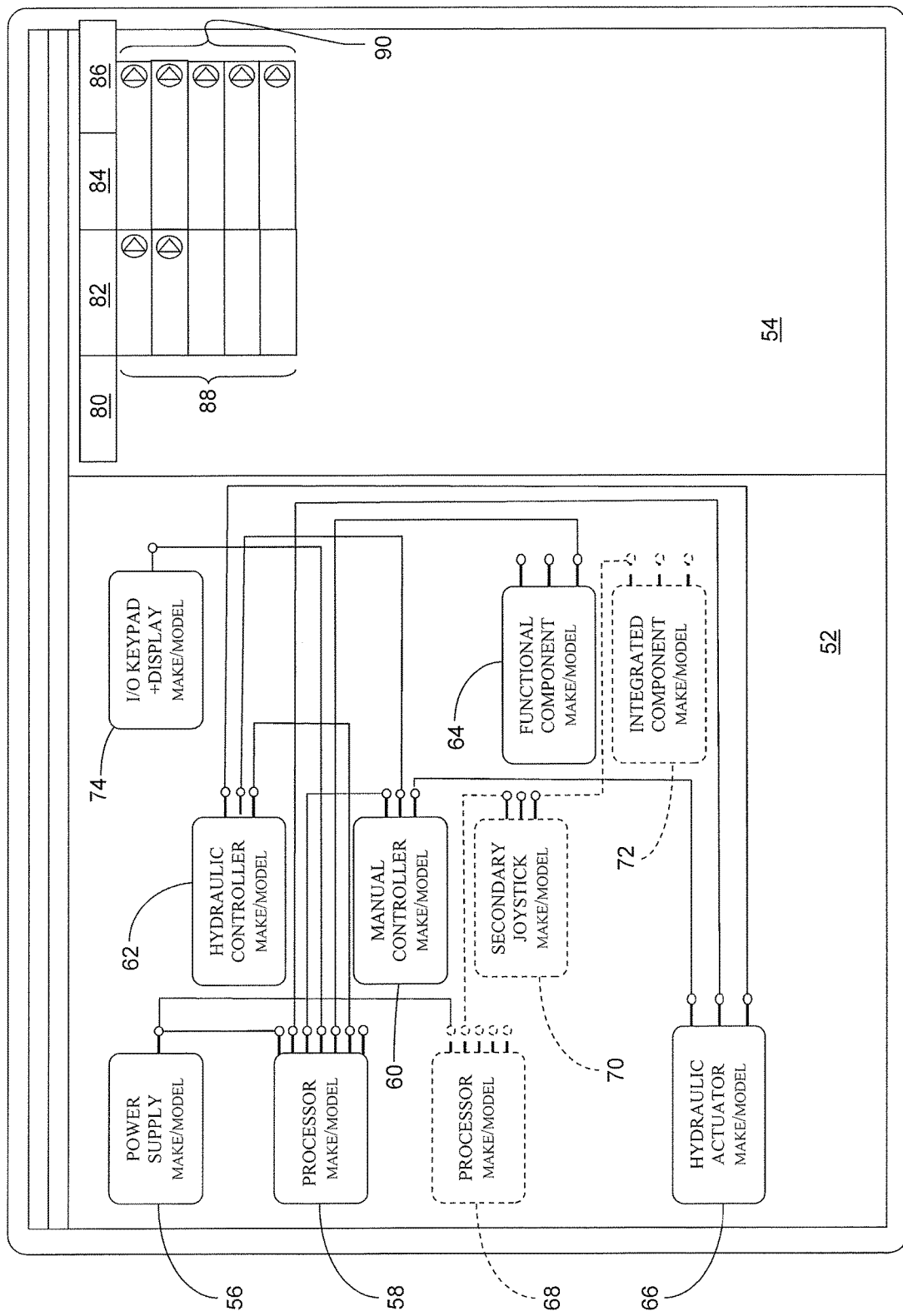
FIG. 2A is a screen display image illustrating an operational layout displayed to the user during use of a preferred embodiment.

Reference is next made to FIG. 2A which provides an overview of the display presentation that the operational user is provided for the purpose of carrying out the functionality of the system of the present invention. Display screen 50 in FIG. 2A is a menu-, cursor-, and pointer-controlled display that allows the user to build a product system using standard (and non-standard) components chosen from drop-down menus and constructed in graphic format on a design canvas. Display screen 50 is generally divided into two sections, design canvas 52 and menu display screen 54. Design canvas 52 is provided to allow the user to insert various components and elements of the overall system into a top-level structural configuration. Design canvas 52 is utilized in conjunction with drop-down menus provided in menu display screen 54 to gradually construct and assemble the overall product system that is the objective of the method. Design canvas 52 allows the user to assemble, by way of block icons within a functionally connected block diagram, the various components utilized in the system. These system elements generally take the form of five or more basic types of elements that are shown by type and by way of example in FIG. 2A. For example, practically every system to be designed will require at least one hydraulic controller 62 and at least one hydraulic actuator 66, and most such systems will also typically require at least one input device, such as is typified in FIG. 2A by I/O keypad 74. Although other components illustrated in FIG. 2A may be integrated with typical hydraulic controllers, the embodiment of FIG. 2A also recognizes the possibility of selecting the particular power supply 56 and/or the particular processor 58 for less-typical variations of a hydraulic system design.

Irrespective of the types of components that make up building blocks for the design of the hydraulic system, as additional elements are desired or required in the design of the overall product system, the user may simply add the further functional elements in the same manner to fill-out the overall design. When and if the safe capacity of the initial controller 62 (or processor 58) is surpassed by the addition of any particular functional element 72, the canvas engine prompts the user accordingly, preferably both (i) alerting the user to the exceeded capacity and (ii) suggesting the substitution of an alternative controller 62' with greater processing power, or the addition of an additional controller and/or an additional processor 68 and/or a substitute processor 58'. Such added functional elements 72 often include either additional sensors/transducers within or in conjunction with primary actuator 66 or additional actuators. Added sensors/transducers are added as might be needed for enhanced control input and/or safety lockouts. Added actuators 66' may be added to drive secondary powered systems and/or a second cylinder of the primary hydraulic actuator 66.

In some instances, controller 60 and actuator 66 may comprise a single element depending upon the device or functional component they are directed to operate, such as is represented by integrated functional element 72. Additional controllers 62, additional processors 68*b*, and additional joysticks or other manual controllers 70, are added as required by the scope and complexity of the overall system being designed.

In the preferred embodiment, the fundamental operational elements include the core controller 62 (which typically includes a built-in processor 58), the joystick or other manual controller 60, and at least one hydraulic actuator 66. Such fundamental operational elements will be prompted by the engine of the conceptual canvas in each design session and may include any of a number of different types of devices or assemblies typically utilized in the overall product system structure. One or more sensors may also be incorporated as elements in the overall system in order to provide the necessary feedback to the controllers and their processors. Input/output display 74 may likewise be an optional element in the system, depending upon the structure and function of the overall product system and its user/operator interaction requirements.

As an example of the manner of using design canvas 52, the user (the individual designing the product system) may be constructing a hydraulically operated lifting machine that includes not only hydraulic lift pistons, but also pumps, joystick controllers, hydraulic actuators, steering devices, and other hydraulically or pneumatically powered equipment. In such an example, one or more controllers may be required that are connected to control input devices such as levers or joysticks. These in turn may be connected to functional components such as individual hydraulic or pneumatic cylinders, hydraulic motors, skid-steer devices, lift pistons, and the like.

Many such hydraulic or pneumatic components require separate actuators that are connected through the controllers to its one or more built-in processors. As indicated above, in some instances the functional component may itself contain the necessary actuator elements or the controller for the component may contain such actuator elements. In some instances, the controller and its processor may be connected directly to the functional component for feedback information, such as from a displacement sensor positioned on and integrated with the component. Limit switches associated with steering mechanisms and hydraulic piston linear motion devices may provide necessary operational and functional feedback to a processor, either directly or by way of the component controller.

As is evident from the above discussion, the complexity of the system is closely tied to the complexity of the individual components that are available for incorporation into the system. This provides evidence of the value of the expert system of the present invention, in that the operational user is not required to have specific knowledge of, or even reference all of the characteristics and functional connection requirements of the individual components. The expert system of the present invention provides such information on an automated basis as the operational user constructs the overall system on the top level design canvas.

Associated with the use of design canvas 52 shown in FIG. 2A is menu display screen 54. In this section of the display presented to the operational user, various drop-down menus (described in greater detail below in FIGS. 3A-3F) are presented for use as the overall system is constructed in the design canvas 52. In the present invention, as an example, the array of drop-down menus provided in menu display screen 54 may include a file menu 80, an edit menu 82, an evaluate menu 84, and a generate derivatives menu 86. In the generic example shown in FIG. 2A, the edit menu 82 is dropped down to display five menu elements 88, the first of which may, for example, be a selection of functional components, which in turn is dropped down to present a list of five (as an example) choices 90 under functional components. In this manner, the operational user progresses through the basic menu elements in order to gradually construct the overall system on the design canvas 52. FIG. 2A provides a typical display for menu display screen 54 wherein a new functional component is being selected and will be incorporated into the overall system being constructed. Descriptions of the specific forms and elements of each of the drop-down menus are provided in greater detail below.

Figure 2B:
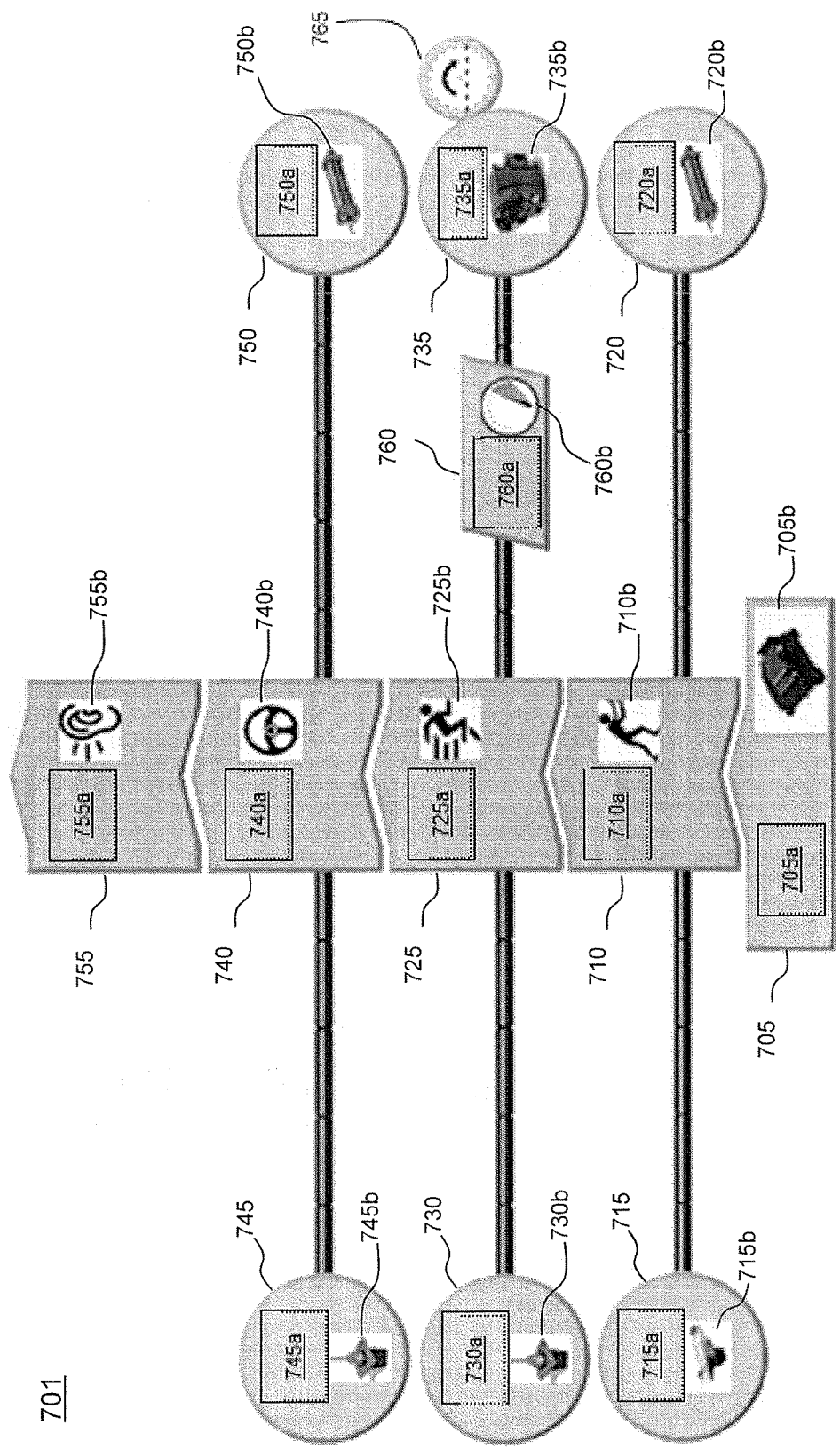
FIG. 2B is a screenshot display image showing an operational layout displayed to the user during use of an alternative embodiment.

Turning now to FIG. 2B, in conjunction with FIGS. 7A-7N as described in more detail below, there is illustrated a display configuration of one preferred embodiment of system 10, provided merely for illustrative purposes and in no way intended as a limiting example of such configuration in relation to the present invention. This representation is a more specific example of the display and process utilized by operational user 34 of system 10, similar to the generic illustration of FIG. 2A.

FIG. 2B represents the entire display configuration of a design for a simple hydraulic system using system 10. The hydraulic system in the illustrated example is a cart with a generator, hydraulics, and arc lights mounted on a mast. Operational user 34 preferably knows the kind and weight of the arc lights required as well as the functional hydraulics needed for the cart. System 10 presents operational user 34 with a diagrammatic representation of the design product system with the key components displayed, clearly demonstrating the functional relationships of each of the added and required components.

As shown in FIG. 2B, the representative display utilizes a tiered system based on functional components added by operational user 34 during the design process. The left-hand column of components illustrated in FIG. 2B represents the possible input devices that may be selected by operational user 34. The middle column represents action algorithms, such actions including movement, steering and the like. In one preferred embodiment, these algorithms control hardware, software, valves and the like. In alternative embodiments, there may be separate columns for such components. The right-hand column represents output actuators available for selection which are capable of carrying out the action represented in the center column by receiving inputs from the input device within the same horizontal tier.

System 10 is programmed and configured with solutions for completing a product design. These solutions are represented graphically by each of the icons in one horizontal tier as shown in FIG. 2B. More specifically, a solution can be defined as one of the horizontal tiers denoting an input device in the left-hand column, an action algorithm represented in the center column, and an output actuator in the right-hand column. Moreover, the icons illustrated in FIG. 2B are clickable such that when operational user 34 clicks on an icon, details are revealed related to that specific component available to be chosen as part of the product design.

Additionally, system 10 is interactive in that questions are asked of operational user 34 in order to establish operational and functional parameters of the product being designed. As these questions are answered and the design parameters are established, system 10 can then provide operational user 34 with a more targeted design application. In other words, the components that system 10 furnishes for selection during the product design process will be those that are capable of operating effectively based on the established design parameters required.

FIG. 3A provides an overview of each of the primary menu columns exploded to first level detail. In this view, the first column is shown to identify four functions associated with the overall design and construction of the product system layout and description. Each product system is designed, constructed, and saved as a digital file and may be printed as required or desired. As shown in FIG. 3A, the user may start out with a new file, work on an existing file, and then save the modifications and form of the file.

In the second column shown in FIG. 3A, the drop-down menu identifies various edit functions that include adding functional components and connections. If existing components and/or connections need to be duplicated, the edit column provides for copy, paste, and cut, so as to modify the existing design canvas configuration.

The third column shown in FIG. 3A provides a drop-down menu for the process of evaluation, primarily associated with a check for errors in any of the combinations of components and their connections. Additional mechanisms for evaluating the product system design and construction being established are anticipated. Costs of components as well as component availability may be relevant information optionally identified under the evaluation menu.

The final column shown in FIG. 3A presents the first level menu items under the generate derivatives process. This list of menu items identifies the end products of the system and method of the present invention and represents both digital copies of the materials as well as printed copies where required. These derivatives or deliverables that result from the operation of the system and method of the present invention will typically include a bill of materials, assembly drawings, wiring diagrams, work instructions, routings, and quality control (QC) instructions.

FIG. 3B discloses the operational step shown generally occurring in FIG. 2A, wherein the editing process has been selected and a new functional component is being identified and selected. Selecting the drop-down menu for functional component (indicated as available by the arrow next to the menu item) opens up a listing of various functional components available to the operator/user to choose from. In the example shown in FIG. 3B these choices include controllers and processors, as well as actuators, sensors, and then finally, a custom functional component. As indicated above with respect to the elements shown in FIG. 2A, additional functional components are anticipated depending upon the specific applications involved. Controllers may be present in addition to or as a substitute for actuators, as an example. Input/output display components may be required as a further example. A power supply may be a given (unselected) component, or one or more power supplies may be added to the list of functional components for selection by the user.

FIG. 3C shows a drop-down menu of controllers (or processors) selected after the functional component drop-down menu has been selected. Under controllers (or processors), all of the various choices available to the user are presented, along with the relevant characteristics of those devices or system elements. In the example shown in FIG. 3C, three processors (or controllers) are presented with differing clock speeds and cache sizes.

FIG. 3D presents a view similar to that in FIG. 3C except that, instead of processors (or controllers), the user is choosing among a number of different actuators. In this case, the three actuators listed present different load and stroke values. Once again the user may select among these various components based upon information available within the database that has been established through templates associated with each of the component types and their specific characteristics, connectivity, availability and cost. In other words, each of the system elements identified under the functional components drop-down menus have been pre-programmed into the database from templates that are standardized according to the specific component characteristics. Such templates and such component definitions may vary over time depending upon the additions to the database provided by the source system producer.

Figure 3E:
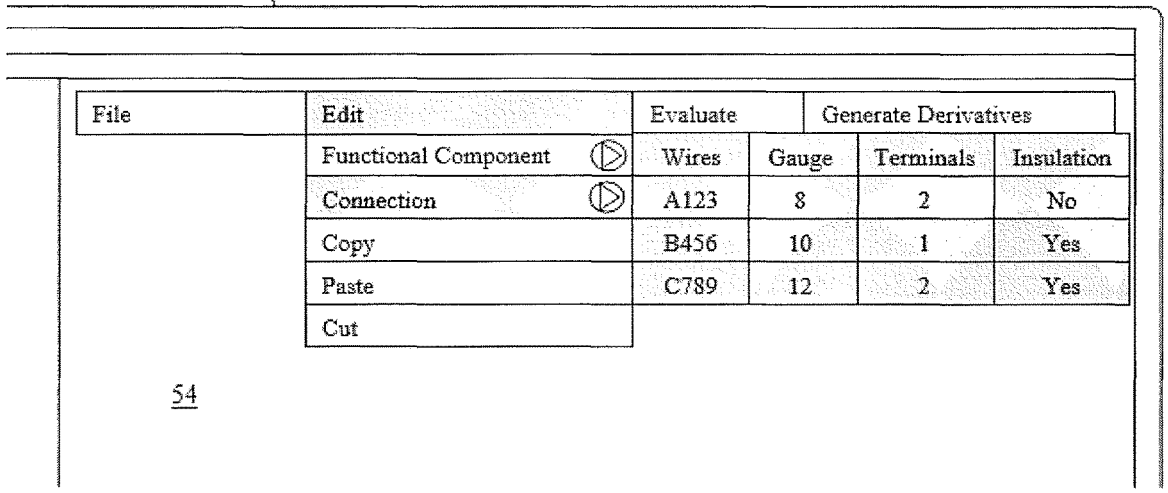

FIG. 3E shows the user switching from the selection of functional components to connections, whereby various interconnections between the components presented on the design canvas may be selected. In this case, the connections are identified as three types of wires for electrical connections. In each instance, the connection is characterized by identifying the wire by name, by gauge, by the number of terminals, and the presence of insulation. Such wiring elements are presented as an example of the different types of connections that could be utilized. Those skilled in the art will recognize that alternate types of connections, as between hydraulic and pneumatic components, for example, will use different types of connections, namely hydraulic or pneumatic hose lines, each with varying diameters and/or pressure limits.

Figure 3F:

FIG. 3F provides yet another example of the manner of selecting a further type of component, in this case, one of a variety of sensors. Here again the user identifies a specific sensor number by its operating frequency and the weight limit on its measurement. It is recognized that, although each of the examples provided above identifies a specific type of component with three different choices, each drop-down menu may provide an extensive list of different types of components, each with an extensive list of available variations of the component. The examples provided herein are featured to facilitate the design of electromechanical machinery that operates through the use of various electrical systems, signal systems, and hydraulic and/or pneumatic systems, all of which are typically microprocessor-controlled through the use of various sensors, controllers, actuators and display devices. A typical front loader piece of equipment, for example, would include an array of hydraulic cylinders, interconnected with hydraulic pumps, pressure sensors, electrical components, signal transducers, and load sensors. The manufacturer of such a front loader may use the system and method of the present invention to create the necessary diagrams, texts, and manuals for both the assembly of the device and its use by the end user. In addition, quality control instructions as mentioned above may further be provided based upon the characteristic templates stored in the updated databases associated with the expert system of the present invention.

Figure 4:
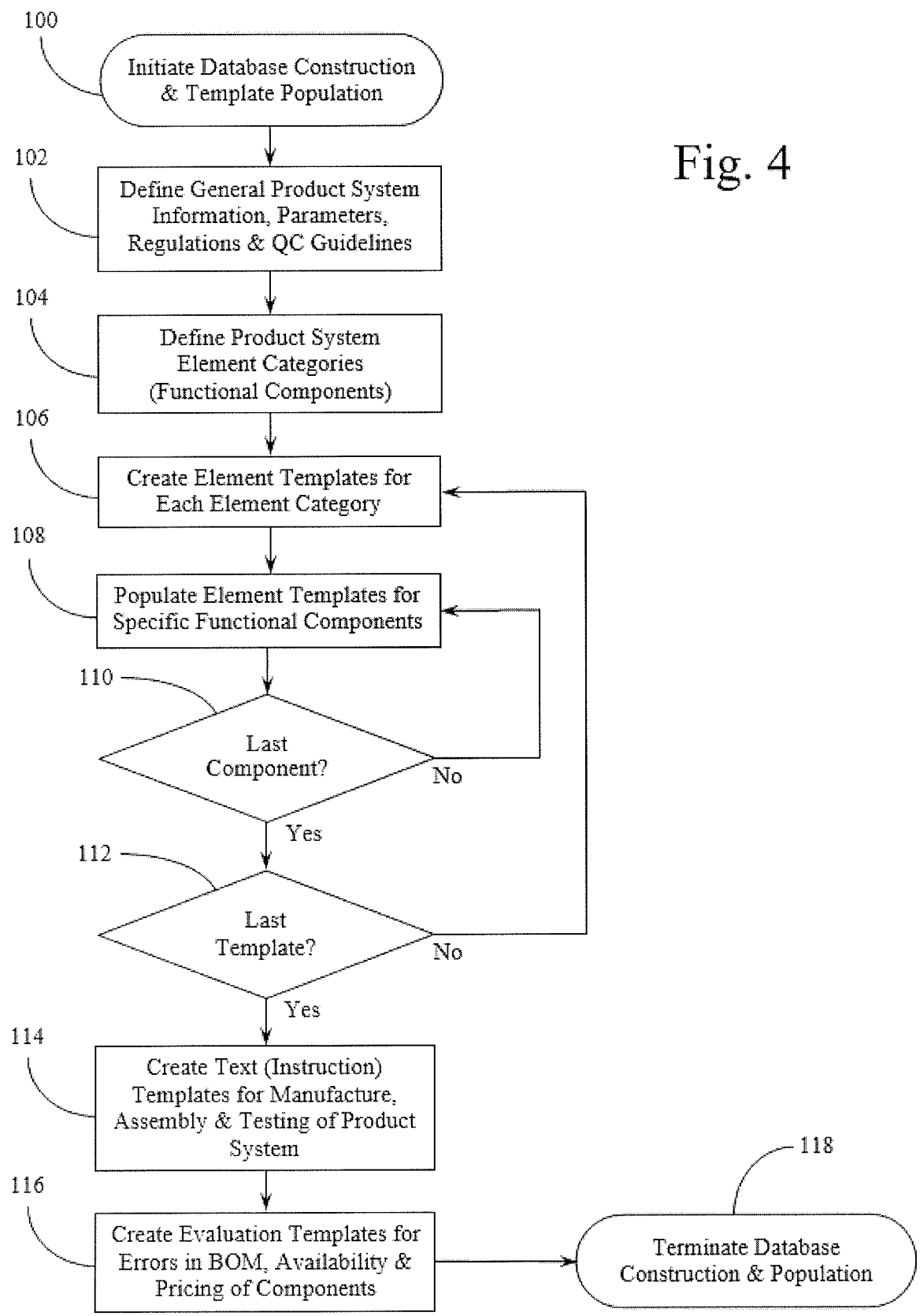
FIG. 4 is a flowchart showing the initial database construction and template population operation of the method of the present invention.

FIG. 4 is a flowchart showing the initial database construction and template population operation of the method of the present invention. As shown in FIG. 4, the expert system of the present invention utilizes an updated database of information on all of the possible functional components and connections that might be incorporated into the product system design and construction. Extensive ancillary information involving the components, their connections, and the structure and function of the overall product system are also included in the database.

Step 100 initiates the database construction and template population. At step 102 the developer provides definitions of the general types of product systems that may be constructed, including overall product system information, parameters, regulations, and quality control (QC) guidelines. Step 104 involves the definition of each product system element categories (the range of functional components that may be selected from). Templates for each element category or type are created at step 106. These templates are then populated, at step 108, with information for each specific functional component available. Query steps 110 & 112 determine whether the last component (within a category) and then the last template have been created and populated. If not, the method returns to add further categories and components. If the last components and templates have been created and populated the method proceeds at Step 114 to create text templates (instructions) for manufacturing procedures, assembly procedures, and testing procedures for the product systems. At this point these text templates are generic and provide the necessary guidance for the construction of the relevant text documents for a specific design and construction of a product system. In a similar manner, Step 116 involves the creation of evaluation templates for errors in the bill of materials, the availability of components, and the pricing of components. The preliminary process shown in FIG. 4 then terminates at Step 118.

Figure 5A:
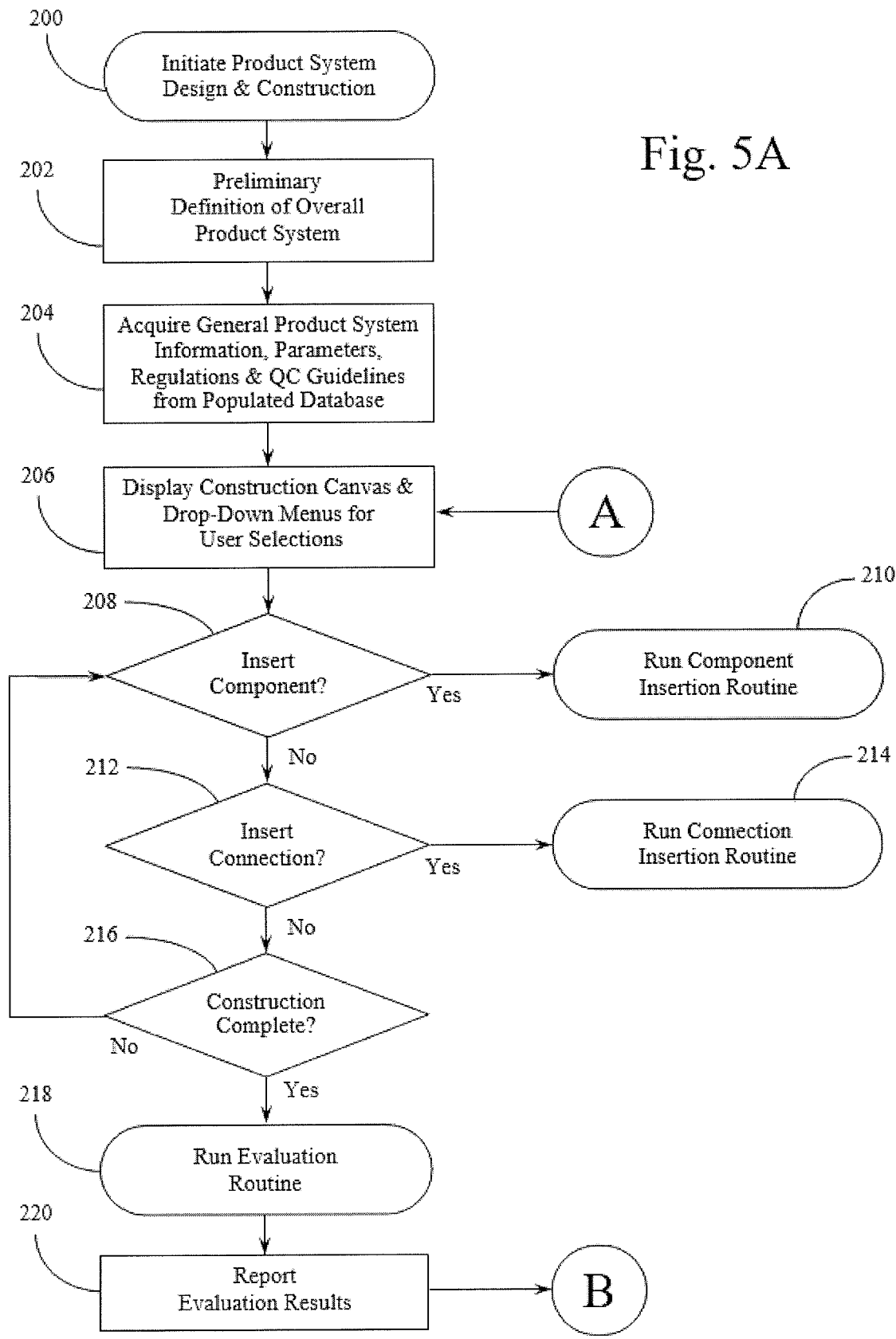
FIGS. 5A & 5B are flowcharts showing the primary design and operation of a preferred method of the present invention.
Figure 5B:
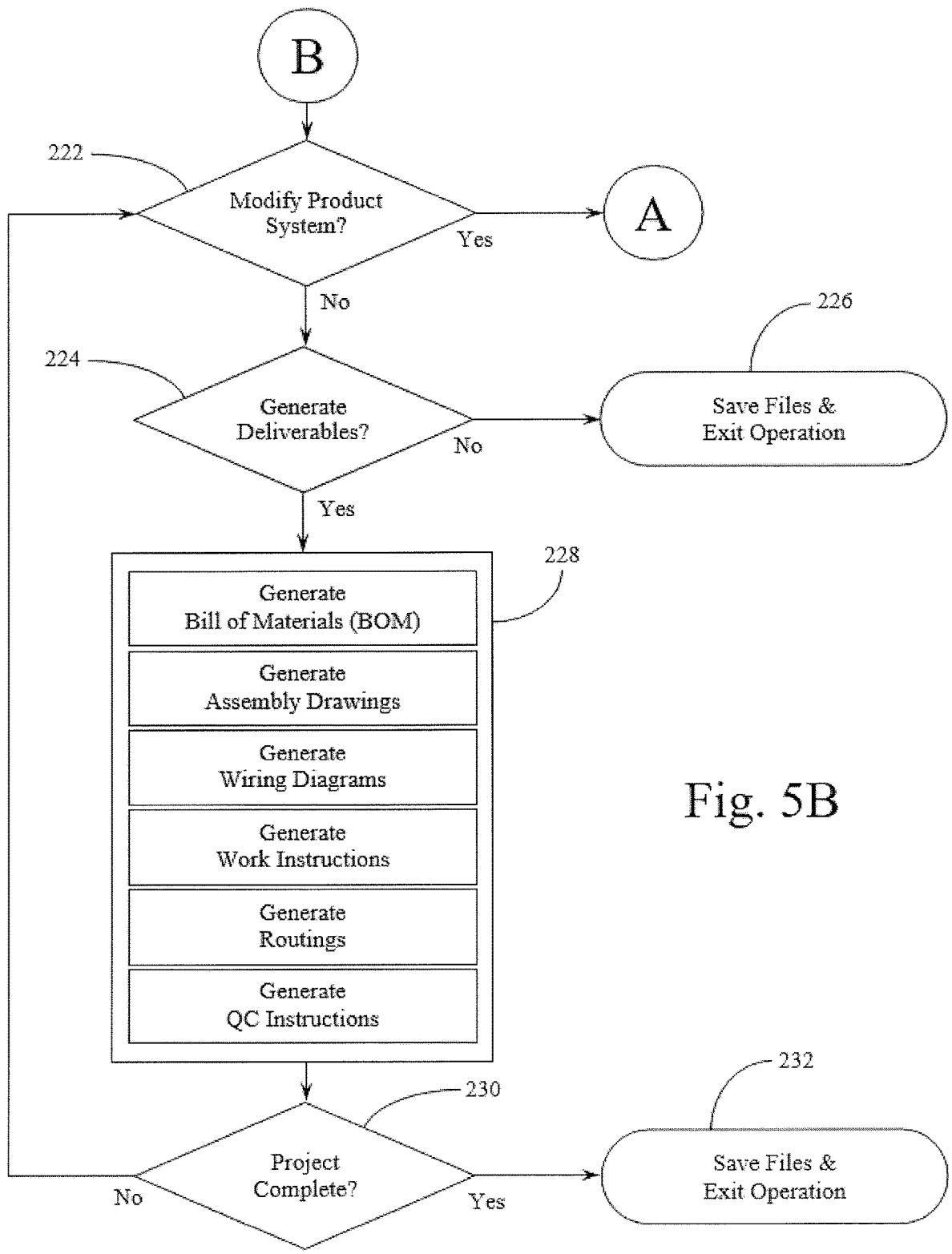

FIGS. 5A & 5B are flowcharts showing the primary product system design and construction operation of the method of the present invention. Once the databases of the system of the present invention have been constructed and populated, the actual operation of the system by the user (the designer of the product system) may be initiated. This occurs beginning at Step 200 shown in FIG. 5A. Step 202 preferably involves a preliminary definition of the overall product system (such as "a fork lift piece of equipment"). This allows the system, at Step 204, to acquire from the databases, the general product system information, parameters, regulations, and quality control (QC) guidelines. The system then displays the design canvas and the drop-down menus (see FIG. 2A) to the user at Step 206.

Driven by the use of the drop-down menus, the system determines through query Steps 208 & 210 if components or connections are to be inserted into the design. If so, the component insertion routine (FIG. 6A) is run at Step 210, and/or the connection insertion routine (FIG. 6B) is run at Step 214. After inserting components and connections, if the construction and design of the product system is complete (Step 216) the process proceeds (on selection by the user) to run an evaluation routine at Step 218. Evaluation results are reported to the user at Step 220. (The process then proceeds through off page link "B" to the flowchart description of FIG. 5B.)

If for any reason (such as issues in the evaluation report) the user desires to modify the product system (query Step 222), the process returns (off page link "A") back to the design canvas and drop-down menu display (see FIG. 2A). If no modification is required then the system queries (Step 224) whether the user is ready to generate the deliverables (derivatives). If not, the user may simply save the project and exit operation at Step 226 (to return later and edit, for example). If the user is ready to generate the derivatives, the process proceeds through Step 228 on a progressive basis according to the deliverables specified as required by the user. These may include: the bill of materials (a text and financial document), assembly drawings (typically a graphic document), wiring diagrams and schematics (a graphic document), work instructions (a text document with manufacture/assembly instructions and user manual materials), routings, and quality control (QC) instructions.

Once all of the deliverables have been generated at Step 228, the process proceeds to query the user (at Step 230) whether the overall project is therefore complete. If not, the process returns the user to the modify product system query Step 222 from which the relevant part of the process may be repeated. If complete, the process terminates at Step 232 with saving the files and exiting operation.

Figure 6A:
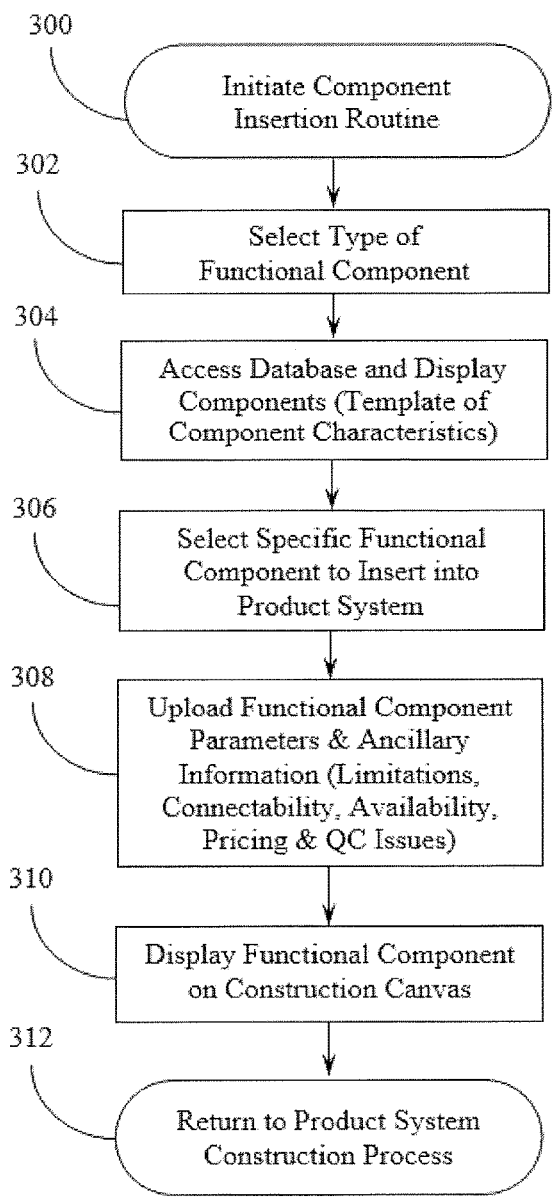
FIGS. 6A & 6B are flowcharts of the component and connection insertion routines called from the design operation illustrated in FIGS. 5A & 5B.
Figure 6B:
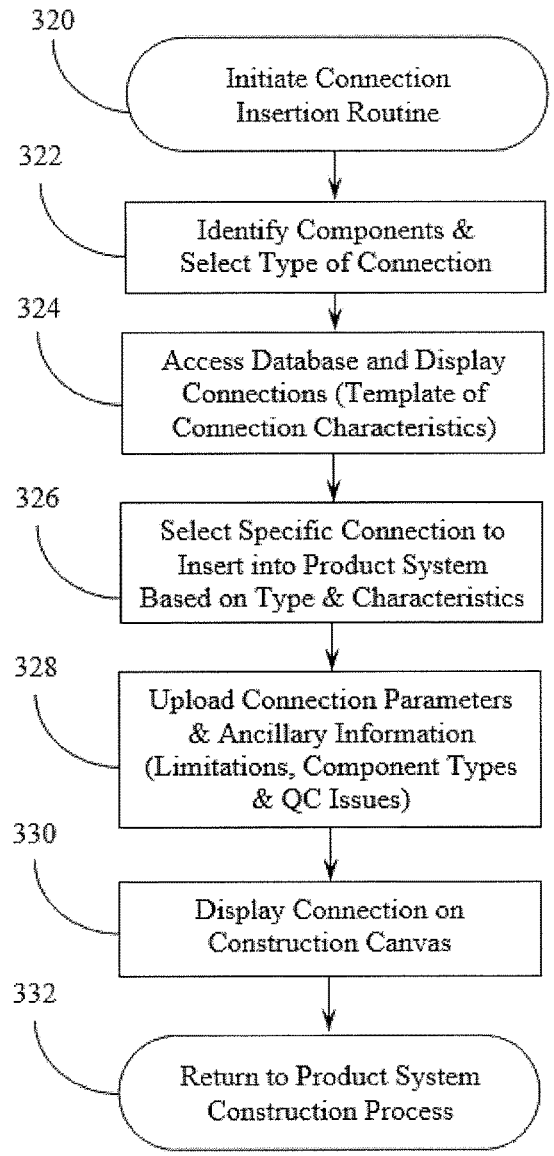

Reference is finally made to FIGS. 6A & 6B which are flowcharts of the component and connection insertion routines called from the design and construction operation shown in FIGS. 5A & 5B. Following from the pull-down menus described above, the user proceeds to Step 300 to initiate the component selection routine. The user first selects the type of functional component (processor, actuator, etc.) at Step 302. The system then accesses the database at Step 304 to display the available components with template information on specific component characteristics. The user then selects (at Step 306) the specific functional component to insert into the product system being designed. This selection is a combination of actions carried out by the user with the drop-down menus and the point and drag of the component icon onto and within the design canvas.

Once selected, an extensive packet of information is uploaded from the system database (at Step 308) that includes all of the functional component parameters, characteristics, limitations, connectability, availability, pricing, as well as regulatory and quality control (QC) issues. The system then displays (Step 310) a representative block icon for the component on the design canvas where the user may manipulate its connection and functional placement within the product system. The method then returns (at Step 312) to the product system construction main process stream (FIGS. 5A & 5B).

The routine for inserting connections into the product system design is carried out in a similar manner. Referring to FIG. 6B, as directed from the flowchart in FIG. 5A, and following from the pull-down menus described above, the user proceeds to step 320 to initiate the connection selection routine. The user first identifies the components being connected and identifies the type of functional connection (electrical power, electrical signal, hydraulic, pneumatic, etc.) at Step 322. The system then accesses the database at step 324 to display the available types of connections with template information on specific connector characteristics. The user then selects (at Step 326) the specific connector element to insert into the product system being designed. This selection is again a combination of actions carried out by the user with the drop-down menus and the point and drag of the connector line indicator onto and within the design canvas.

Once a connection is selected, an extensive packet of information is also uploaded from the system database (at Step 328) that includes all of that connection's parameters, characteristics, limitations, and loads, as well as regulatory and quality control (QC) issues. The system then displays (Step 330) a representative line for the connector on the design canvas where the user may manipulate its connection to the relevant functional components within the product system. The method then returns (at Step 332) to the product system construction main process stream (FIGS. 5A & 5B).

Once a layout is established on the canvas, there are a number of derivatives that will be automatically generated through selection of the Generate Derivatives menu selection on the top menu positions. There are a number of components that will all require these derivatives to be generated in support of the ordering, design, and manufacture of the final product.

The components that will require derivatives to be generated for them will include controllers (or processors), actuators, sensors, and custom functional components.

Hydraulic Controllers (and their Processors)

For the hydraulic controllers (or processors), upon selection of the Generate Derivatives menu option, there are a number of possible selections that can be chosen. These include BOM (Bill of Materials), Assembly Drawings, Wiring Diagrams, Work Instructions, Routings, Manufacturing Quality Control (QC) Instructions and User Guides.

The BOM (Bill of Materials) represents the structure of the product in terms of its raw materials. To the extent that processors (rather than hydraulic controllers with built-in predetermined processors) can be separately selected, a processor is a multi-purpose, programmable electronic device that consists of memory, a central processing unit, as well as input and output controls.

The Assembly Drawings for the controller (or its processor) contain information on how the controller (or processor) fits on the layout as shown on the canvas. The drawings themselves detail how the inputs and outputs fit into the product design and programming.

The Wiring Diagrams for the controller (or processor) detail the connections that the circuitry going into the processor and the circuitry leaving the processor entail. The diagrams show the connections by pin location and along with the assembly diagrams call out the connecting materials required to complete the wiring.

The Work Instructions for the controller (or processor) are a derivative of the wiring diagrams and assembly drawings. These work instructions detail in text what is required of the wiring diagrams and how the wiring diagrams related to the controller (or processor) are to be completed.

The Routings and Manufacturing Quality Control (QC) Instructions are additional derivatives that are generated through the process of utilizing a controller (or processor) in the completion of the product as detailed on the canvas. The routings provide information about how the work instructions are to be carried out and by which station within the manufacturing plant. Likewise, the manufacturing quality control instructions for the controller (or processor) detail those aspects of manufacturing that need to be taken into consideration during construction that are a signal of proper quality or would indicate that a quality issue is possible for the controller (or processor) component.

Actuators

For actuators, upon selection of the Generate Derivatives menu option, there are a number of possible selections that can be chosen. These include BOM (Bill of Materials), Assembly Drawings, Wiring Diagrams, Work Instructions, Routings, Manufacturing Quality Control Instructions and User Guides.

The BOM (Bill of Materials) represents the structure of the product in terms of its raw materials. For an actuator, the BOM contains descriptions of the quantity and type of tie rods, end cap, adjusting screw, yoke, stem clamp, bushings, o-rings, actuator stems, piston, seals, springs, gaskets, and bellows required to construct the actuator.

The Assembly Drawings for the actuator show how it is put together with any other components required as detailed on the completed canvas.

The Wiring Diagrams for the actuator details how the actuator is being controlled electronically by the other components that are a part of the completed canvas. The components that control the actuator and the wiring required, as detailed on the canvas, show the connections for the actuator inputs and actuator outputs as necessary.

The Work Instructions created for the actuator is a derivative of the assembly drawings and wiring diagrams required to enable operation of the actuator. Through detailed text descriptions, the work instructions list how the wiring diagrams and assembly instructions are to be completed according to the product designed on the canvas.

The Routings and Manufacturing Quality Control (QC) Instructions are additional derivatives that are generated through the process of utilizing an actuator in the completion of the product as detailed on the canvas. The routings provide information about how the work instructions are to be carried out and by which station within the manufacturing plant. Likewise, the manufacturing quality control instructions for the actuator detail those aspects of manufacturing that need to be taken into consideration during construction that are a signal of proper quality or would indicate that a quality issue is possible for the actuator component.

Sensors

For sensors (also referred to as "transducers"), upon selection of the Generate Derivatives menu option, there are a number of possible selections that can be chosen. These include BOM (Bill of Materials), Assembly Drawings, Wiring Diagrams, Work Instructions, Routings, Manufacturing Quality Control (QC) Instructions and User Guides.

The BOM (Bill of Materials) represents the structure of the product in terms of its raw materials. For a sensor, the BOM contains descriptions of the quantity and type of electronics, case/insulation, backing material, piezoelectric crystal, and matching layer.

The Assembly Drawings for the sensor contain information on how the sensor fits on the layout as shown on the canvas. The drawings themselves detail how the inputs and outputs of the sensor fit into the product design and performance.

The Wiring Diagrams for the sensor detail the connections that the circuitry going into the sensor and the circuitry leaving the sensor entail. The diagrams show the connections to the sensor inputs and leaving from the sensor outputs when connecting to other components.

The Work Instructions for the sensor are a derivative of the wiring diagrams and assembly drawings. These work instructions detail in text what is required of the wiring diagrams and how the wiring diagrams related to the sensor are to be completed.

The Routings and Manufacturing Quality Control (QC) Instructions are additional derivatives that are generated through the process of utilizing a sensor in the completion of the product as detailed on the canvas. The routings provide information about how the work instructions are to be carried out and by which station within the manufacturing plant. Likewise, the manufacturing quality control instructions for the sensor detail those aspects of manufacturing that need to be taken into consideration during construction that are a signal of proper quality or would indicate that a quality issue is possible for the sensor component.

Custom Functional Components

For Custom Functional Components, upon selection of the Generate Derivatives menu option, there are a number of possible selections that can be chosen. These include BOM (Bill of Materials), Assembly Drawings, Wiring Diagrams, Work Instructions, Routings, Manufacturing Quality Control (QC) Instructions and User Guides.

The BOM (Bill of Materials) represents the structure of the product in terms of its raw materials. For a custom functional component the BOM can include any parts detailed on the canvas that are required to manufacture the end product.

The Assembly Drawings for the custom functional component show how it is put together with any other components required as detailed on the completed canvas.

The Wiring Diagrams for the custom functional component details how the said component is being controlled electronically by the other components that are a part of the completed canvas. The components that control the custom functional component and the wiring required as detailed on the canvas show the connections for the custom functional component input and custom functional component outputs as necessary.

The Work Instructions created for the custom functional component is a derivative of the assembly drawings and wiring diagrams required to enable operation of the custom functional component. Through detailed text descriptions, the work instructions list how the wiring diagrams and assembly instructions are to be completed according to the product designed on the canvas.

The Routings and Manufacturing Quality Control (QC) Instructions are additional derivatives that are generated through the process of utilizing a custom functional component in the completion of the product as detailed on the canvas. The routings provide information about how the work instructions are to be carried out and by which station within the manufacturing plant. Likewise, the manufacturing quality control instructions for the custom functional component detail those aspects of manufacturing that need to be taken into consideration during construction that are a signal of proper quality or would indicate that a quality issue is possible for the custom functional component.

Figure 7A:
FIGS. 7A-7N illustrate successive screenshot display images that are representative of one embodiment of the invention, particularly showing a sequence of images displayed to the user on a graphic interface during the process of designing a comprehensive electromechanically controlled hydraulic system.
Figure 7B:
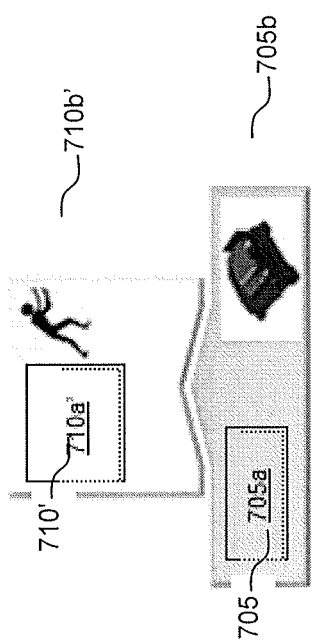
Figure 7C:
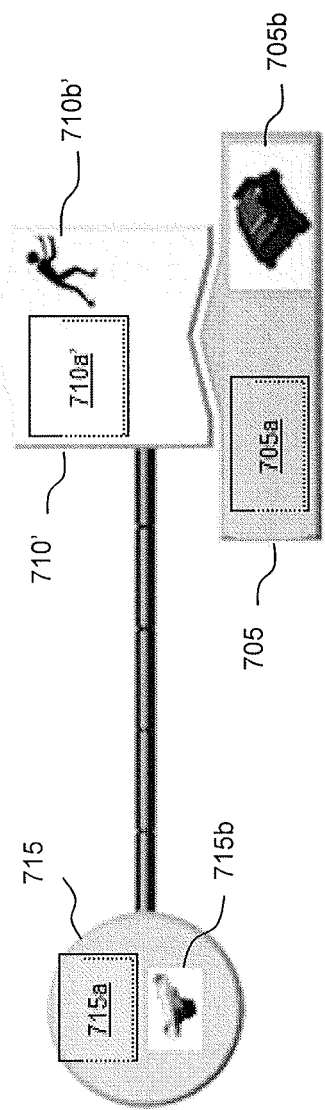
Figure 7D:
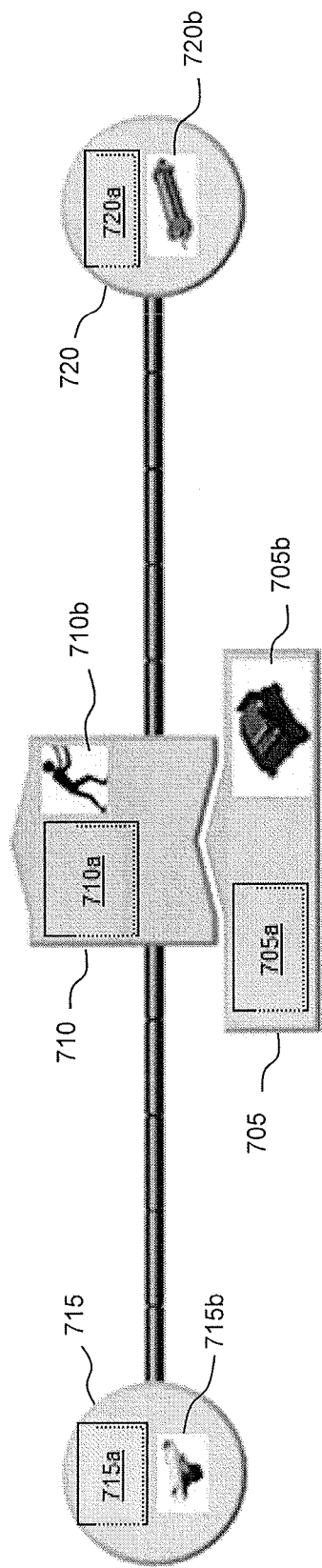
Figure 7E:
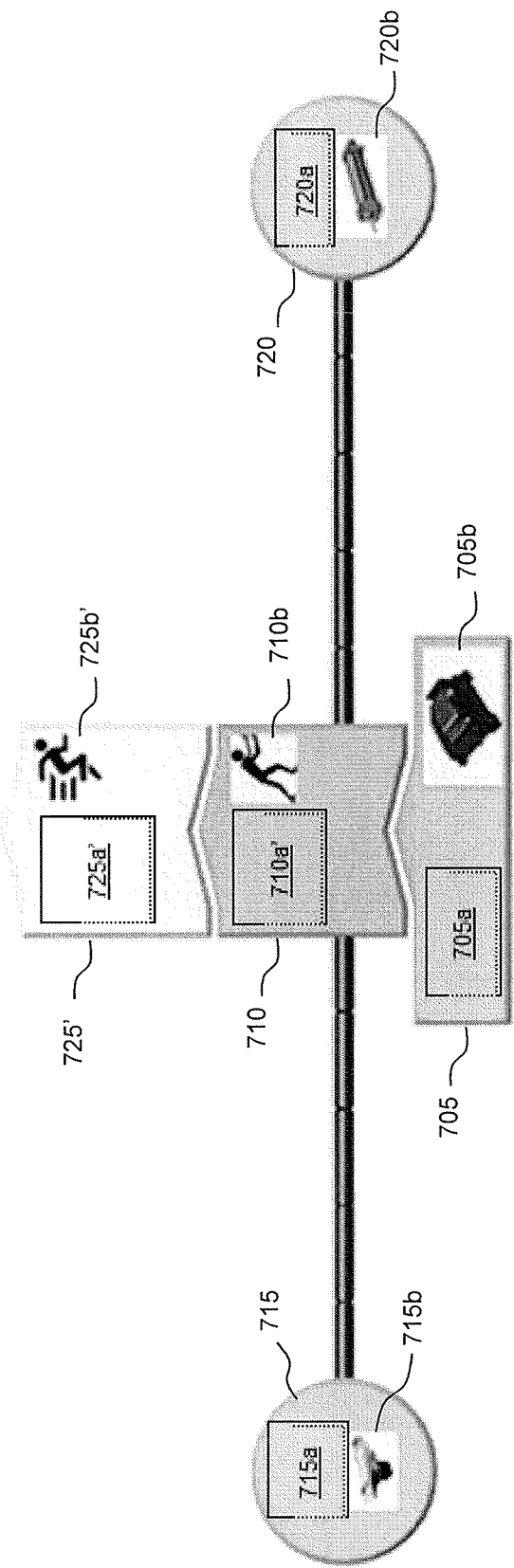
Figure 7F:
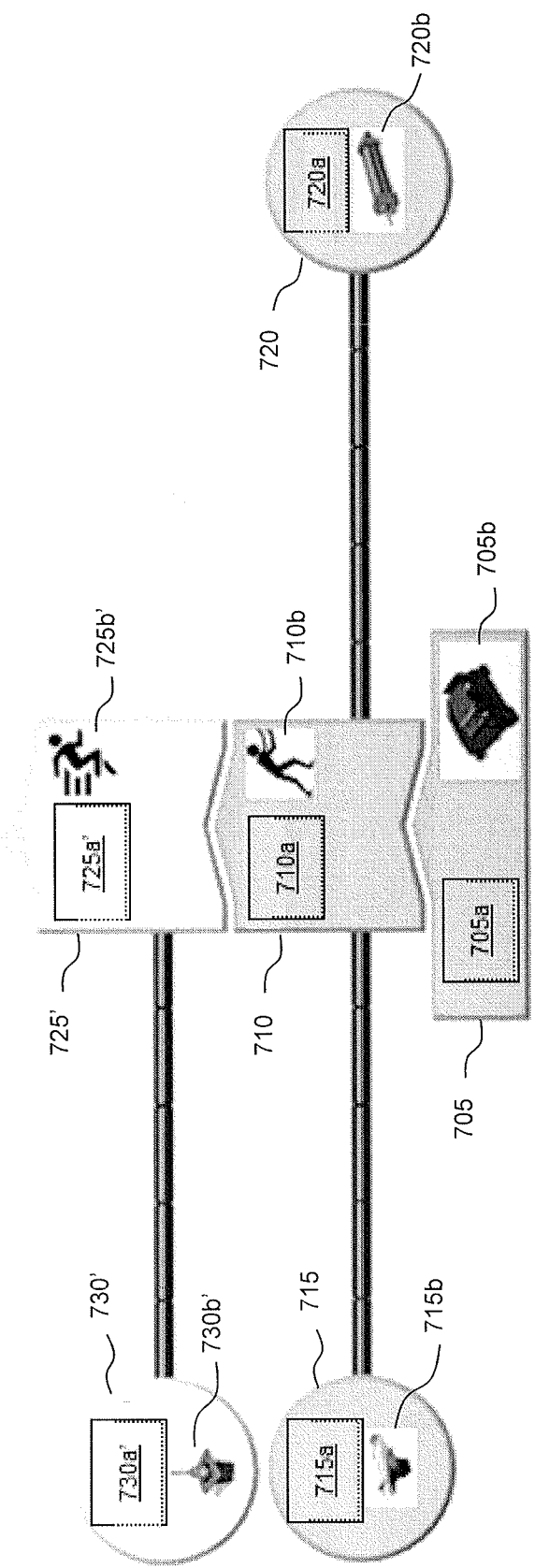
Figure 7G:
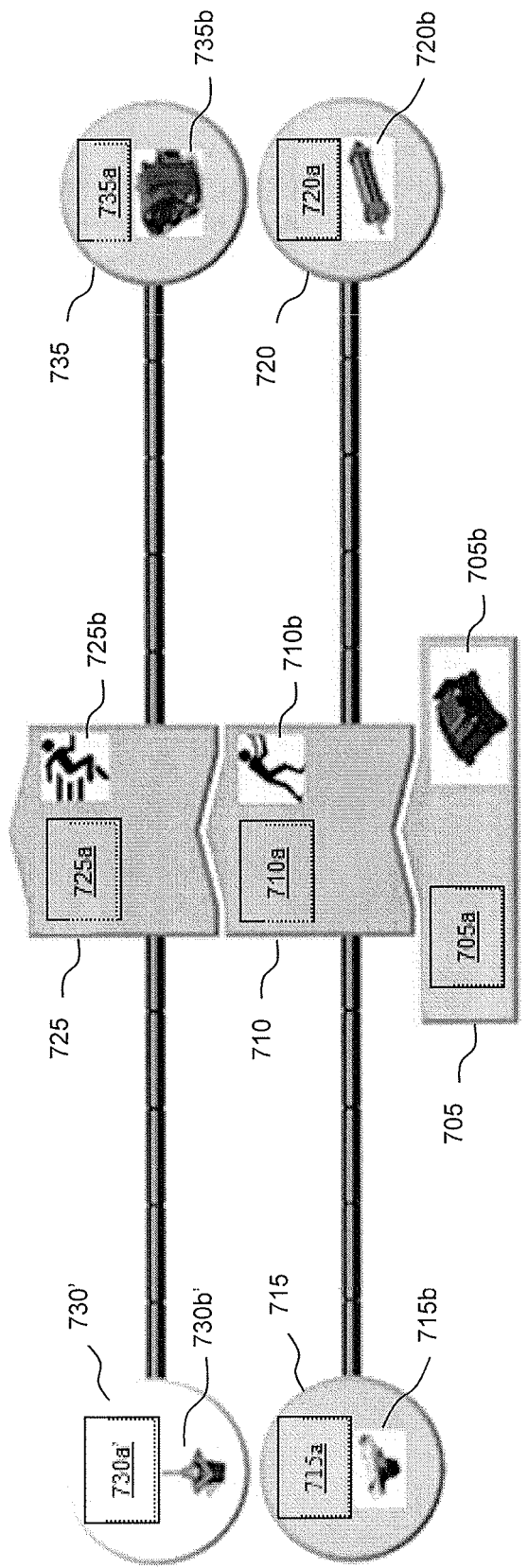
Figure 7H:
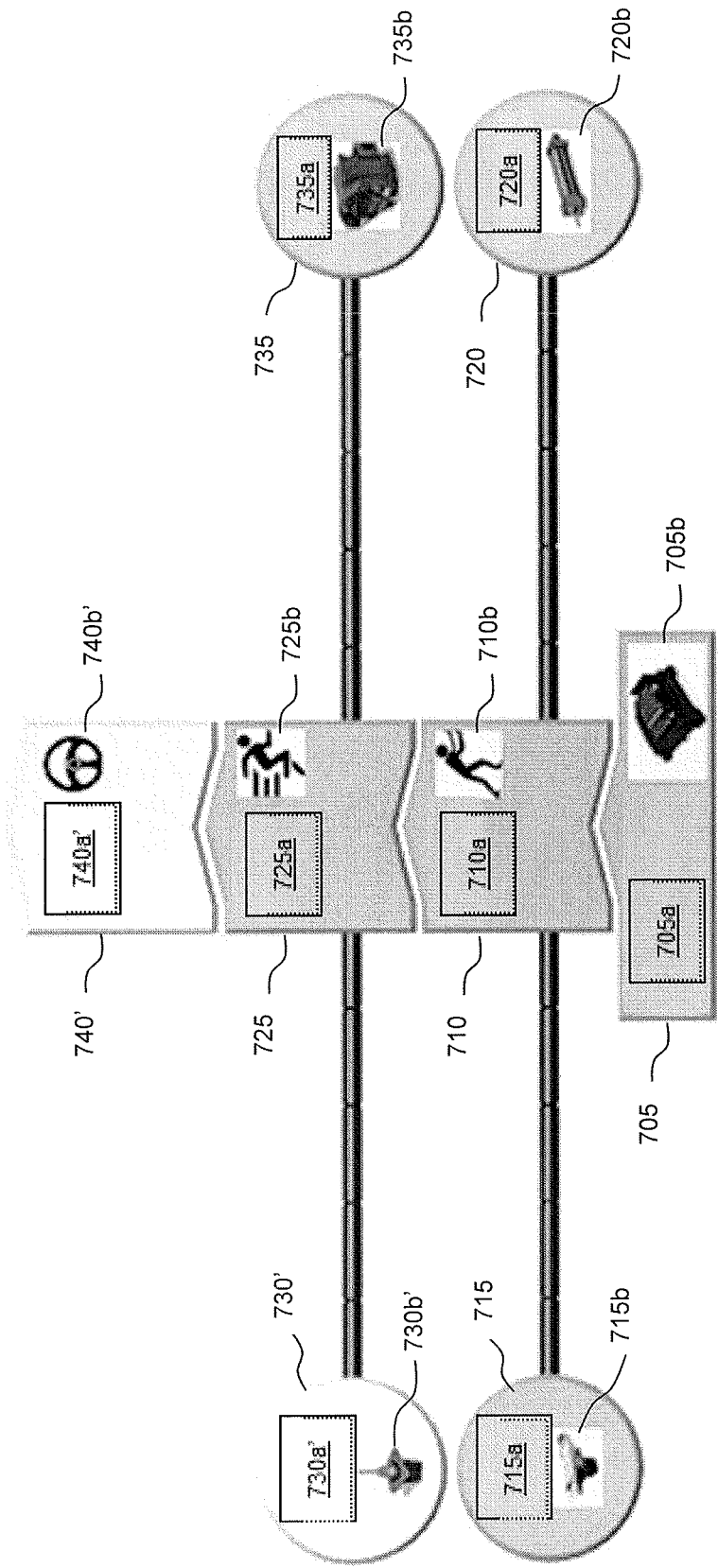
Figure 7I:
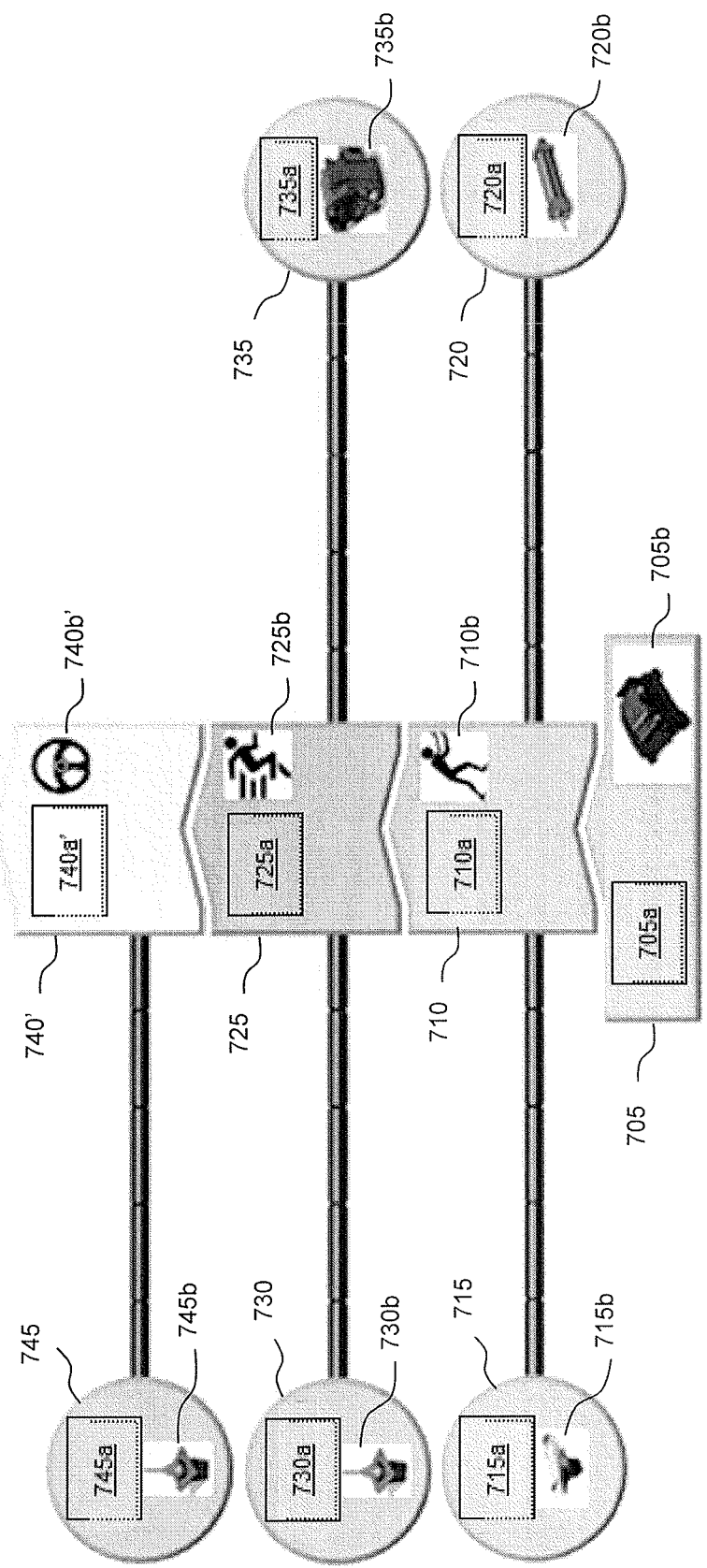
Figure 7J:
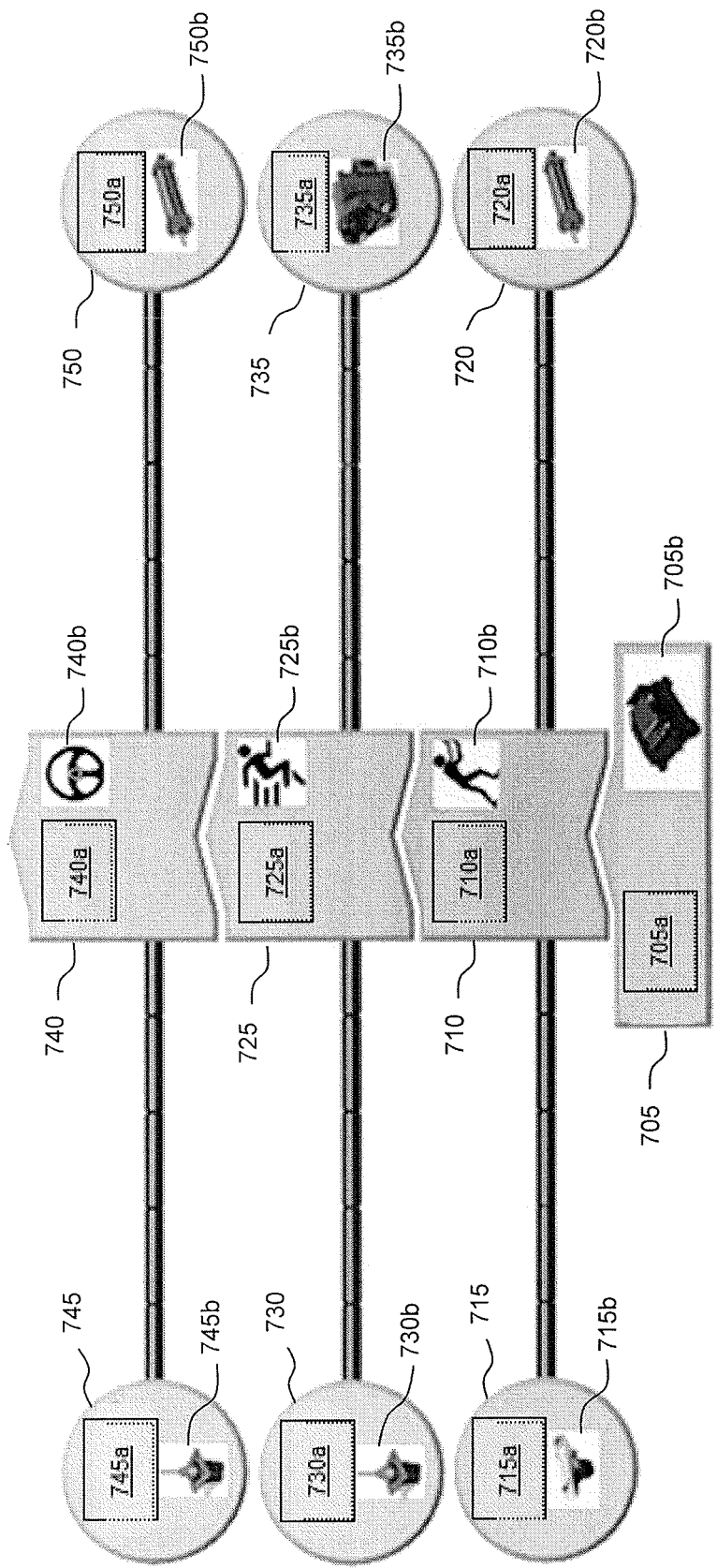
Figure 7K:
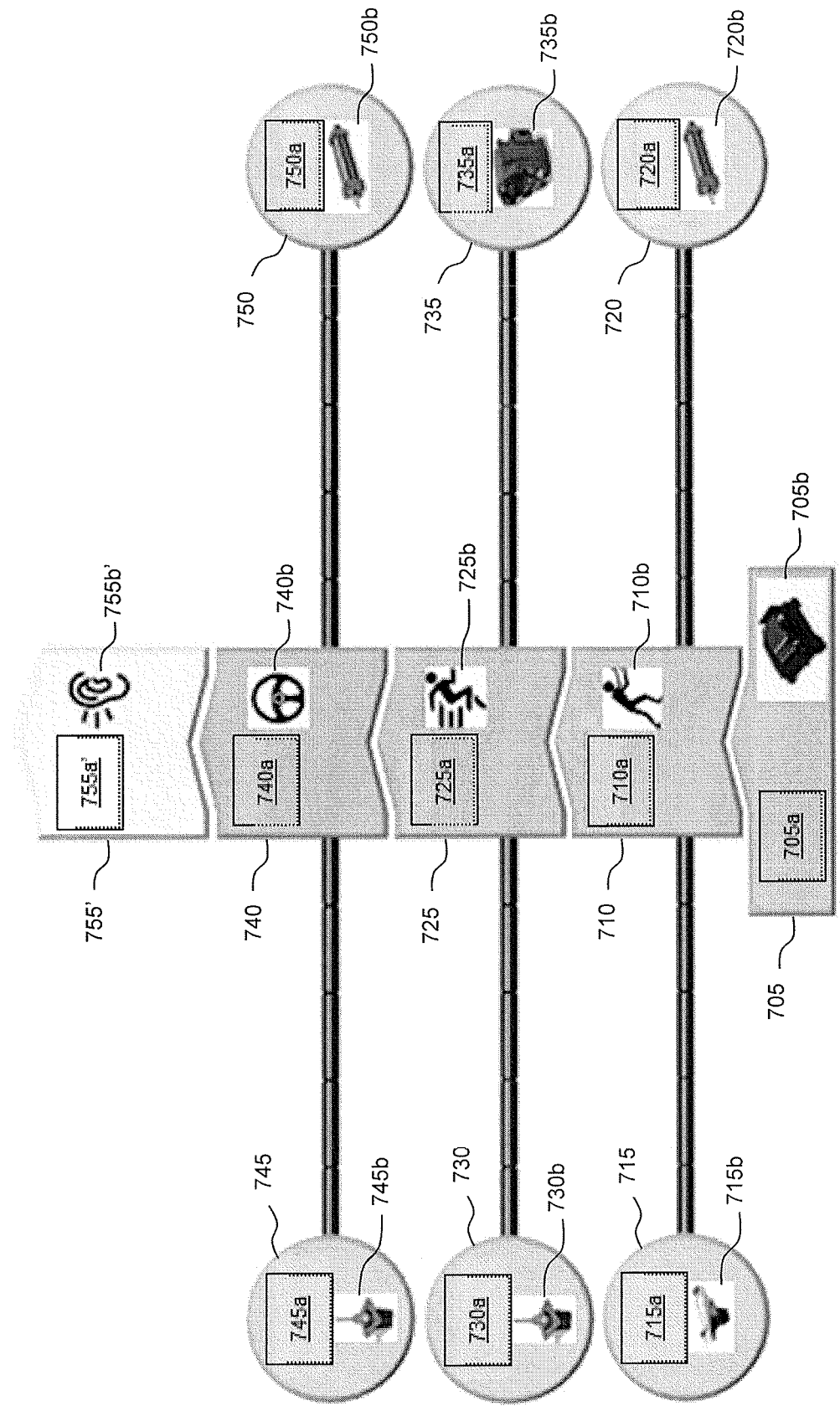
Figure 7L:
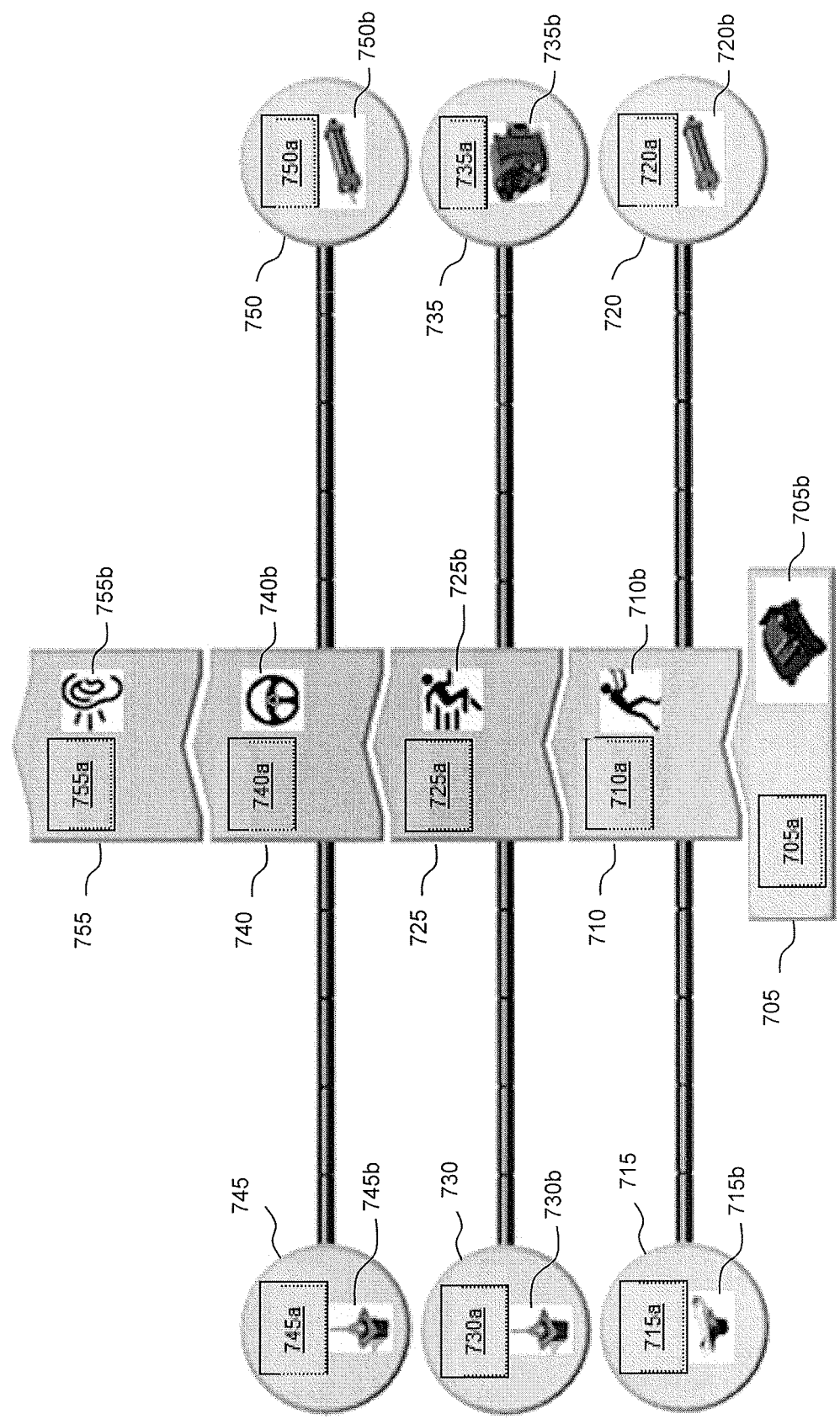
Figure 7M:
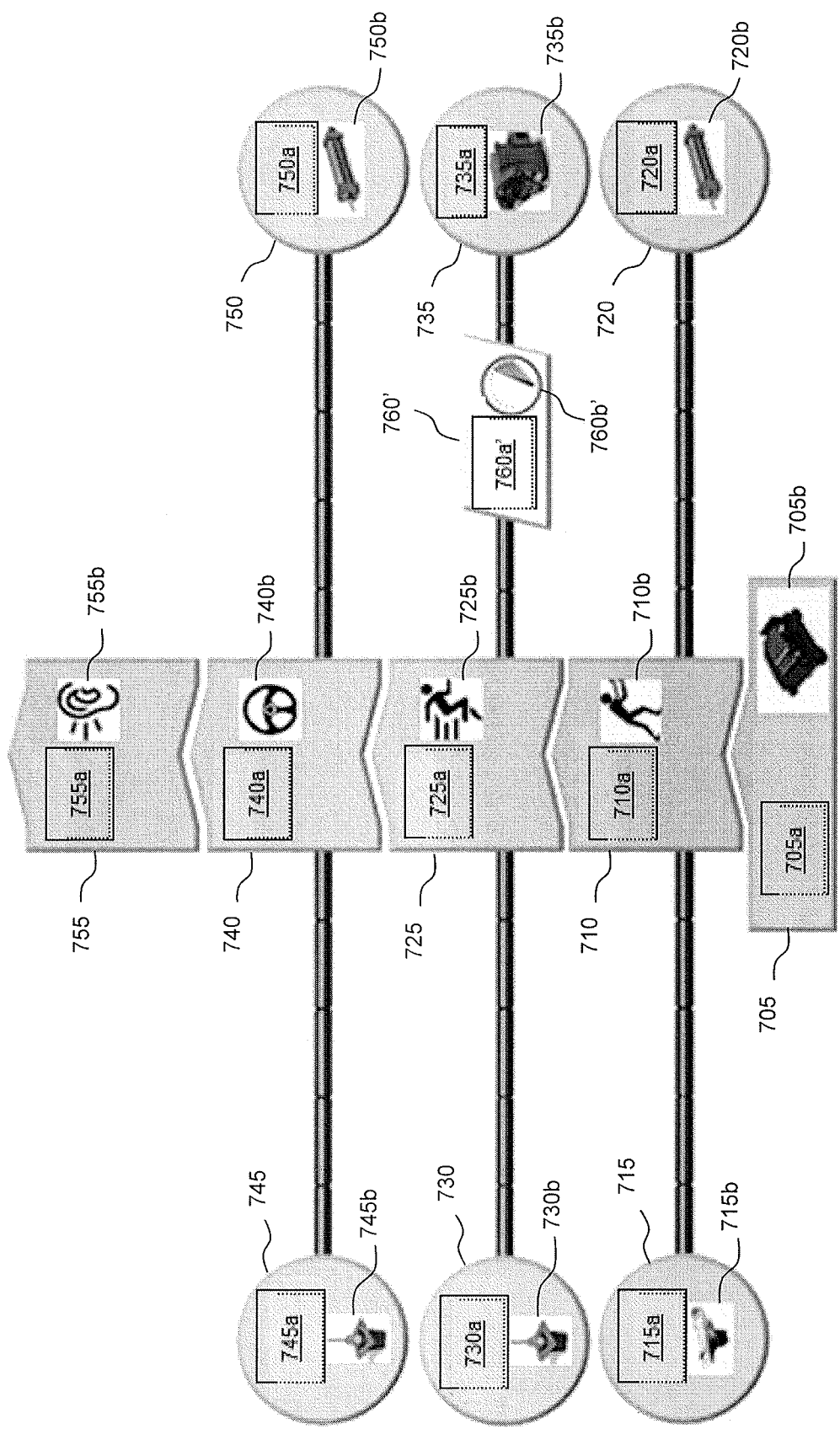
Figure 7N:
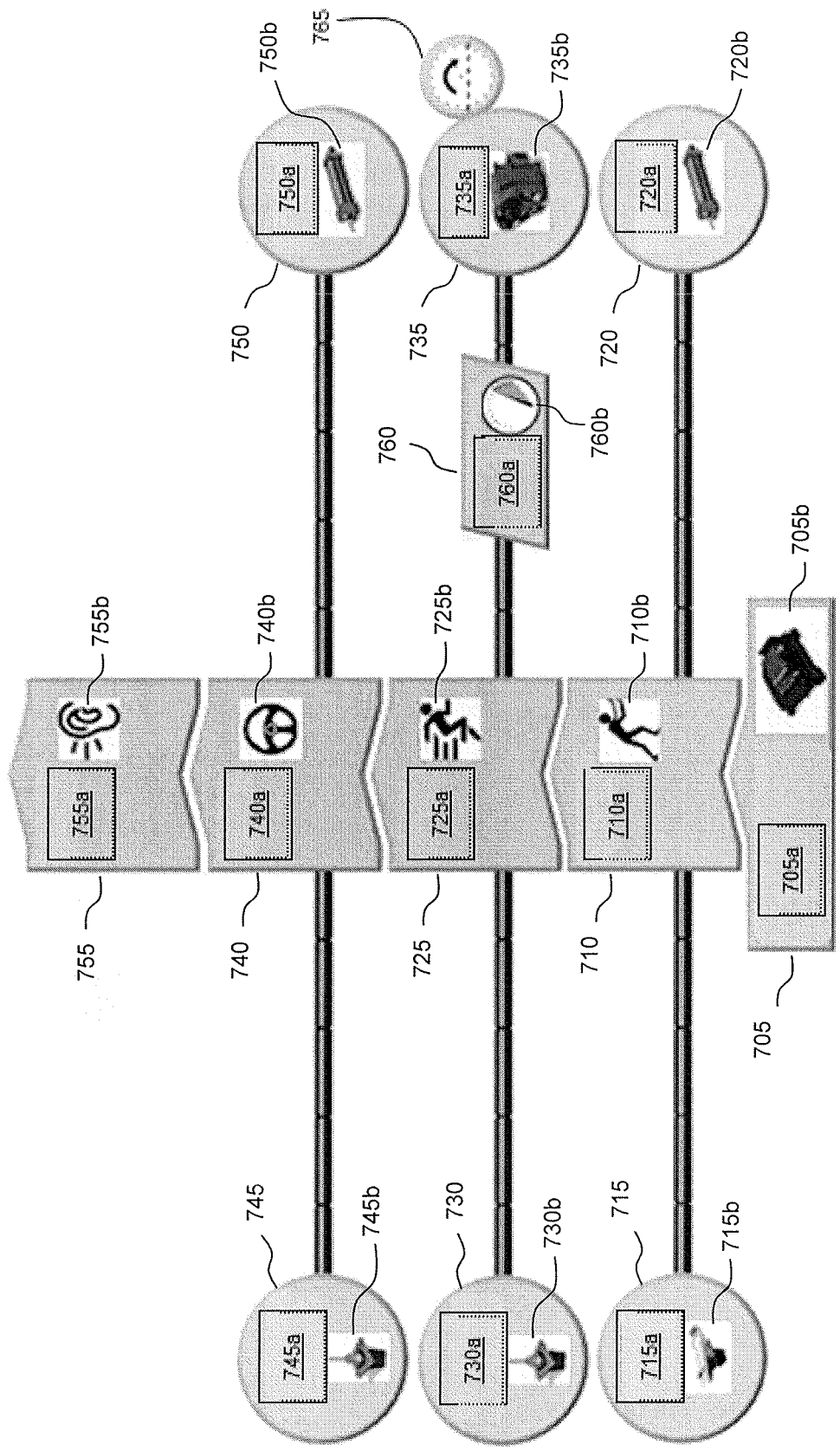

Referring now to FIGS. 7A-7N, there is shown the sequence, in a step-by-step manner, of an example of a specific simple hydraulics product design as illustrated in its entirety in FIG. 2B, the product being a mobile cart with a mast. System 10 is programmed to ask questions in order to determine which components should be made available for selection by operational user 34 for the specific needs of the product design. These questions preferably relate to the operating parameters required by the product being designed. While by no means an exhaustive list, more precisely, such questions may relate to the speed at which the product must move, how much weight the product must be capable of lifting, how resistant to the environment it must be, what industry standards must be met, as well as questions relating to redundancy and safety. As operational user 34 answers these and other possible questions relating to the functional and operational parameters required of the product being designed, system 10 will analyze the myriad possible pre-configured solutions based on the answers provided by operational user 34, and system 10 will provide a template within which operational user 34 can add components necessary to complete the product design.

As illustrated in the screenshot representation of system 10 shown in FIG. 7A, the first component to be selected is a hydraulics controller represented by green block icon 705, and shown pictorially within icon 705 as image 705b. The system will provide a selectable range of controllers with varying capabilities. The choices available for selection are based in part on the number of inputs and outputs (I/O) each controller has and may include a 12 I/O controller manufactured by Eaton, or others such as 20 I/O, 32 I/O, or 48 I/O controllers. Other manufactured controllers may be available for selection and use with a product design utilizing system 10. Each controller is equipped with both digital and analog inputs, as well as frequency inputs and frequency outputs. The choice of controller(s) available for selection by operational user 34 will be one that system 10 has determined, based on responses by operational user 34 to preliminary questions relating to the operational parameters under which the design product must function, is minimally capable of performing the required functions of the product. However, as will be discussed in further detail below, as operational user 34 continues to add components during the product design, system 10 will continuously reevaluate whether the selected components, in combination with other components as selected, will perform adequately. Therefore, regardless of which controller may initially be selected, operational user 34 will have the option to upsize the controller for future expandability.

As a component is selected, an icon representing that component will be viewable in system 10 to operational user 34. For instance, the text on the icon shown in FIG. 7A for the selected controller, represented by Text Box 705a, may read, "CONTROLLER: EATON HFX12m," indicating that the controller selected is an Eaton controller, model HFX12m (or a 12 I/O controller). The text in each icon for each selected component of the product design will provide a generic identification of the type of component along with a more specific description of the component. Again, a pictorial representation of each added component may appear on the icon, as further illustrated in FIG. 7A as image 705b showing the controller.

Preferably a color-coded scheme is employed indicating whether a particular component selected is adequate based on the design product's required operating parameters, or whether more information may be needed from operational user 34. For example, shown in FIG. 7B is the next step in the product design. The icon representing the selected controller is green. This would indicate to operational user 34 that no further action need be taken with regard to this added component, namely that this step in the design requires no further input from operational user 34. After a suitable controller has been selected, the next component to be chosen is based on input from operational user 34 regarding the purpose and functional characteristics required of the product being designed, which in this illustrated example is a component that must be capable of carrying out a push/pull function. Operational user 34 then selects a component, which in this example is a mast, that is able to perform such a function. Operational user 34 then selects a mast capable of functioning as required which is designated by the yellow icon 710, with image 710b' showing a pictorial representation of the mast, above the controller icon. The description provided by system 10 and represented by Text Box 710a' may read "ACTION: PUSH/PULL" with a more specific reference to the actual component such as "RAISE MAST." Icon 710 would appear yellow because merely selecting this component based on the action this component must be capable of performing does not complete this portion of the product design. More information is required from operational user 34 in order to complete this addition to the product design. Operational user must then select a suitable input device to operate in conjunction with the mast.

Continuing with the illustrated step-by-step example, FIG. 7C shows the input device operational user 34 has selected to operate the mast previously added to the design. System 10 will provide various input devices capable of operating the component that has been selected. In the illustrated example shown in FIG. 7C, operational user selects a foot pedal represented by green icon 715 and pictorially shown as image 715b. The description of the mast, represented by Text Box 715a provides a generic description of "INPUT: PEDAL," with a more detailed description of the component selected, such as "FOOT PEDAL 01," meaning this is the first such pedal selected for the product design, as well as more detail with regard to the foot pedal's operating characteristics, such as "ANALOG" and "CAN BUS" or a controller area network bus. Again, the components provided by system 10 from which operational user 34 may select have been predetermined to be at least minimally capable of performing the functions required based on input into system 10 from operational user 34 with regard to the functional and operational requirements of the product being designed.

Icon 715 depicting the mast as shown in FIG. 7C is still yellow after operational user 34 has selected a suitable input device because more input from operational user 34 is required to complete this portion of the product design, namely the need to select an appropriate output actuator which is capable of operating the mast chosen. FIG. 7D illustrates the selection of such an output actuator, being a lift cylinder represented by icon 720 with the lift cylinder also being depicted pictorially therein as image 720b. A further description of this component addition, as represented by Text Box 720a, might include the generic description of this component such as "ACTUATOR: CYLINDER," with a more detailed description being "LIFT CYLINDER." Moreover, as also shown in FIG. 7D, the icon representing the action algorithm in the center of the first tier of product design additions, specifically the mast selected by operational user 34, is now depicted as green in color. This color change from yellow to green indicates to operational user 34 that the device selected, in this example being the mast, is now fully committed. In other words, this tier of the product design in system 10 is complete by having a device (mast) with both an input device (foot pedal) and an output actuator (lift cylinder) having been selected that are capable of operating the selected device.

Turning now to FIG. 7E, since operational user 34 in the illustrated example requires the cart being designed to be mobile, system 10 prompts operational user to select a method to enable mobility of the cart. The action algorithm, or the center icon, in the next tier of solutions shown in FIG. 7E relates to the addition of such capability. For example, yellow icon 725' shown in FIG. 7E pictorially depicts this mobile capability in the form of a person in motion as image 725b'. The description of this action algorithm, as represented by Text Box 725a', may provide a generic description, such as "ACTION: PROPEL," with a more detailed description being "DRIVE WHEELS." Once again, icon 725' is yellow in color because this design step is not yet complete. Operational user 34 must also select an appropriate input device and output actuator which are both capable of operating the selected drive wheels in order to complete this horizontal tier of the product design.

FIG. 7F illustrates the next step in the product design, wherein operational user 34 must select a suitable input device to work in cooperation with the drive wheels selected in FIG. 7E. Similarly, and as previously described with reference to FIG. 7C, system 10 will provide a list of appropriate input devices which are capable of performing as required and according to the operational parameters as input by operational user 34 into system 10. In the illustrated example shown in FIG. 7F, operational user selects a joystick, indicated by yellow icon 730', as well as being depicted pictorially as image 730b', which appears in the left column of the second horizontal tier of solutions. The characterization of the joystick, as represented by Text Box 730a', may include a generic identification, such as "INPUT: JOYSTICK," and a more detailed description reading "JOYSTICK 01: Y-AXIS," the "01" indicating that this is the first joystick selected in this particular product design, as well as specifying the axis in which this joystick will function with regard to operating the drive wheels as selected. Additionally, information may be provided relating to the operational characteristics of the selected joystick, such as "ANALOG SHARED" and "CAN BUS."

In FIG. 7F, icon 730' which represents the input device, specifically the selected joystick, is yellow for two reasons. As previously described with regard to the first tier, an appropriate output actuator must be selected to operate with the selected drive wheels and joystick. Furthermore, as indicated above with reference to the axis in which this joystick will operate the drive wheels, only one axis (the Y-axis) has been selected. System 10 is programmed to recognize that only one action of control, in this case moving the cart forward, is required. However, icon 730' is yellow because system 10 also is programmed to recognize that the selected joystick is capable of operating in another axis, namely the X-axis, which has not been selected as part of this tier in the product design. As a result of this recognition by system 10, and as illustrated in FIG. 7G, once the appropriate output actuator is selected, in this example a drive motor, icon 730' representing the joystick remains yellow.

When selecting a suitable output actuator for operating the drive wheels, system 10 will provide a pre-configured list of devices that are minimally capable of performing this task based on the functional and operational parameters of the product being designed as is input into system 10 by operational user 34. In the illustrated example, operational user 34 selects a drive motor which is represented by green icon 735, with a pictorial representation of the selected drive motor shown as image 735b. Once selected, system 10 provides a description of the output actuator, such description represented by Text Box 735a in FIG. 7G, the text of which includes a generic identification of the type of device selected ("ACTUATOR: MOTOR"), as well as a more specific description ("DRIVE MOTOR").

Continuing with the illustrated example, if operational user 34 requires the cart being designed to include steering capability, system 10 will provide devices capable of performing this task. As shown in FIG. 7H, the next solution tier begins with operational user selecting the required action, in this case, steering. This selection is depicted in yellow icon 740' with Text Box 740a' characterizing both the generic action description ("ACTION: STEER"), as well as a slightly more detailed description of the action selected ("STEERING"). As has been previously described, the new action algorithm icon 740' shown in FIG. 7H is yellow because operational user 34 must still select both an appropriate input device and output actuator to perform the chosen action.

Referring now to FIGS. 7I & 7J, there is shown a screenshot of system 10 illustrating the selection of an input device, in this example being a joystick as represented by green icon 745 with the pictorial representation as image 745b, as well as an output actuator, in the present example being a lift cylinder which is represented by green icon 750, as well as being depicted pictorially in image 750b. As is illustrated in FIG. 7J, icons 740, 745 & 750 in the top horizontal tier are now green, which indicates that the steering component is now complete. The description of the joystick, as represented by Text Box 745a includes the generic identification ("INPUT: JOYSTICK"), as well as the more detailed description of the input device selected ("JOYSTICK 01: X-AXIS; ANALOG/SHARED; CAN BUS"). As previously stated, icon 745 representing the joystick is now green as opposed to yellow because both actions in which the selected joystick is capable of operating, particularly functioning in both the X- and Y-axes are now committed as selections in this illustrated example of the product design. In other preferred embodiments, rather than having two icons representing the joystick operating in each of the two axes, there may be a single icon shown with the two different connections attached to this single icon. This graphical configuration would clearly indicate to any user of system 10 that such a component is actually only a single device.

With reference to FIGS. 7K & 7L, there is shown a screenshot of system 10 wherein operational user 34 chooses to create an interlock, in other words placing one or more limitations on the ability of the design product to operate based on conditions defined by operational user 34. Continuing with the product design sample, FIG. 7K illustrates wherein operational user 34 may choose to add a sensor to the cart design. For instance, operational user 34 may choose to prevent the cart from moving if the cart is tilted too far from a level attitude. In this case, system 10 allows operational user 34 to add a sensor to detect the tilt angle of the cart from zero or a level position. This sensor addition is illustrated in FIG. 7K as yellow icon 755' and depicted pictorially as sound waves entering an ear in image 755$b'$. The description of this added sensor is represented by Text Box 755$a'$, having first a generic identification ("ACTION: SENSOR"), as well as a more specific description of the type of sensor being added ("LEVEL SENSOR").

System 10 will inquire if operational user 34 would like to add interlocks with other systems already added as part of the product design. If operational user 34 answers affirmatively, system 10 will present other questions requiring a response from operational user 34 in order for operational user 34 to define the interlocks. For example, operational user 34 may require that the mast added earlier in the product design process cannot be raised if the level sensor is not level. Once all required interlocks are defined with regard to the level sensor added to the design, icon 755' representing the level sensor in system 10 will change color from yellow to green. This representation is shown in FIG. 7L, wherein the action icon 755 for the added level sensor is shown in green.

Referring now to FIGS. 7M & 7N, there is shown a screenshot of system 10 wherein operational user 34 requires a speed control function as an element of the product design. As part of controlling the speed of the design product, e.g., the cart being designed in the present illustrated example, some method of measuring speed would be necessary. This is illustrated in FIG. 7M as the additional yellow icon 760' located between icon 725 representing the drive wheels and icon 735 to the right of this representing the drive motor. A description of this additional icon 760', represented in FIG. 7M as Text Box 760$a'$, could be shown as "OVERSPEED DETECTION" with the graphical representation of a speed or velocity measuring device depicted as image 760$b'$. This Overspeed Detection icon 760' is yellow in color at this stage of the product design because system 10 recognizes that controlling the speed of the cart requires some other addition to the design. More specifically, adding a speed control mechanism within the design of the cart would necessarily require some addition or modification to the motor, illustrated graphically in FIGS. 7M & 7N at icon 735 with Text Box 735$a$. This addition/modification is shown in FIG. 7N as a graphical addition 765 to the drive motor icon 735. Operational user 34 would be required to add this component, such as an encoder, to the shaft of the cart's drive motor in order to obtain speed control. This encoder would technically be a second input device working in cooperation with the cart's drive motor, but would be physically attached to the drive motor as part of the cart's design.

Preferred embodiments of the present invention allow for such additions to be added to other components as limitations on the operating parameters of these components. Within system 10, this would include a graphical representation of these limits as additions to the components upon which operational limits are sought to be place.

As previously described, whenever operational user 34 selects a component to add on to the product design and system 10 requires more information in order to determine which components within its database would be capable of performing as required, system 10 will prompt operational user 34 to provide whatever additional information is necessary to complete that portion of the product design. For example, as described with reference to FIGS. 7A-7N, preferred embodiments utilize a color-coding system to alert operational user 34 as to when more information is required. Validation occurs at every step in the product design process to ensure that all necessary components are added to the product design and that such components are capable of operating within the design parameters input by operational user 34. Graphical icons appearing in system 10 that are green are complete within the product design, with no further action or information required to be provided. In contrast, when operational user selects a component with the graphical icon being yellow in color, this alerts operational user 34 that more information may be needed with regard to such components. Other embodiments of the present invention may utilize a computer utility such as a wizard that could be programmed to force all required information be provided one step at a time to create a solution or basic action tier within system 10.

Embodiments according the teachings of the present invention, as a result of the integrated multi-scopal coordination enabled by the present invention, allow a single design manager to complete the design in multiple technical disciples—electric, hydraulic and mechanical—within a single design session. Ideally, such a session is a single, continuous period of time of less than an hour, although manageable interruptions can be tolerated within the scope of the invention while still taking advantage of its benefits. Even with some interruptions, a design process can be completed in any case in less than a day, such that human error is not exacerbated by the disconnect from one work session to another.

One object of the preferred embodiments of system 10 is to generate executable computer code, usable by the selected controller(s) within the product design, as an output of the product design. For example, once a solution (i.e., a horizontal tier within the graphical representation of system 10's product design) is fully complete, such as when an action algorithm along with its corresponding device has been selected and a suitable appropriate input device and output actuator have been selected to operate the actionable device, system 10 will then generate code that can be downloaded to and utilized by the selected controller in order to ensure the proper functioning of the product which is designed within system 10. Moreover, a revolutionary aspect of this capability of system 10 to download executable code to the controller as part of the product design, when certain problems occur, these problems can be more easily mitigated. For example, if a designed system is completed but some of the terminals are reversed in an electrical input component of the steering system of the product, the resulting operation of the steering may be contrary to what is required based on the design parameters established. One solution would be to employ people to physically repair the problem by rewiring the terminal. However, system 10 can provide the ability to go into the software and reverse the action. Thus, the control code for the affected terminals may be reloaded to all of the appropriate controllers in order to have the designed system operate as intended.

In all respects, it should also be understood that the drawings and detailed description herein are to be regarded in an illustrative rather than a restrictive manner, and are not intended to limit the invention to the particular forms and examples disclosed. Rather, the invention includes all embodiments and methods within the scope and spirit of the invention as claimed, as the claims may be amended, replaced or otherwise modified during the course of related prosecution. Any current, amended, or added claims should be interpreted to embrace all further modifications, changes, rearrangements, substitutions, alternatives, design choices, and embodiments that may be evident to those of skill in the art, whether now known or later discovered. In any case, all substantially equivalent systems, articles, and methods should be considered within the scope of the invention and, absent express indication otherwise, all structural or functional equivalents are anticipated to remain within the spirit and scope of the present inventive system and method.

The invention claimed is:

1. An automated design system for facilitating intelligent design and coordinating the generation of design documentation for electromechanically controlled hydraulic systems, said automated design system comprising:
   (a) a local server configured for providing access to operational application software as well as database information pertaining to the design characteristics of said electromechanically controlled hydraulic systems;
   (b) a local processor configured in electronic communication with said local server, said local processor being configured for receiving said database information and executable aspects of said operational application software from said local server and said local processor being programmed to execute said executable aspects when prompted to do so by an operational user, retrieving said database information, as well as said executable aspects from said local server;
   (c) a display device associated with said local processor for graphically displaying a plurality of design options correlating to a design canvas for the design of said electromechanically controlled hydraulic systems;
   (d) a data input device associated with said local processor for accepting a plurality of design parameters related to the design options entered by said operational user;
   (e) said operational application software being adapted to interface with said data input device to enable said operational user to select appropriate functional components of said electromechanically controlled hydraulic systems from templates standardized according to specific component characteristics, wherein upon selection by said operational user during a design process, each of said selected functional components is incorporated into the design of said electromechanically controlled hydraulic system; and
   (f) said operational application software being further adapted to interface with a graphical user interface to graphically display the current progress in the design process by characteristically displaying said selected functional components, wherein said selected functional components are graphically linked.

2. The automated design system as in claim 1, further comprising a first output device being configured for providing a plurality of text-based documents pertaining to said design characteristics of said electromechanically controlled hydraulic systems.

3. The automated design system as in claim 1, further comprising a second output device being configured for providing a plurality of graphical representations pertaining to said design characteristics of said electromechanically controlled hydraulic systems.

4. The automated design system as in claim 1, wherein said functional components include a first grouping, a second grouping, and a third grouping of said functional components.

5. The automated design system as in claim 4, wherein:
   (a) said first grouping includes identification of functional components that serve as hydraulic controllers;
   (b) said second grouping includes identification of functional components that serve as input devices; and
   (c) said third grouping includes identification of functional components that serve as hydraulic actuators.

6. The automated design system as in claim 1, further comprising:
   (a) a main server configured in electronic communication with said local server;
   (b) a database server configured in electronic communication with said main server as well as with said local server, wherein said database server is programmed for building and storing said templates and said database information; and
   (c) a data input station comprising said local processor configured in electronic communication with said database server, and whereby a data input operator inputs information into said local processor for building said templates correlating to various components of said electromechanically controlled hydraulic systems.

7. The automated design system as in claim 1, further comprising a display screen including said design canvas and a drop-down menu screen.

8. The automated design system as in claim 7, wherein said drop-down menu screen is adapted to present a plurality of drop-down menus enabling said operational user to:
   (a) create and edit files relating to the design of said electromechanically controlled hydraulic systems utilizing said plurality of drop-down menus by selecting functional/operational components and elements specific to design requirements of said electromechanically controlled hydraulic systems;
   (b) evaluate the design inputs for errors which may be present based on the design input; and
   (c) generate a plurality of documents, diagrams, and instructions specific to said electromechanically controlled hydraulic systems as configured.

9. The automated design system as in claim 8, wherein said functional/operational components include one or more processors, one or more manual controllers, a hydraulic controller, and one or more hydraulic actuators.

10. The automated design system as in claim 9, wherein said one or more manual controllers comprises a joystick.

11. The automated design system as in claim 9, wherein said hydraulic controller and said one or more hydraulic actuators comprise a single integrated functional/operational component.

12. The automated design system as in claim 8, wherein said plurality of drop-down menus comprise:
   (a) a file menu to create a new digital design file, to select and modify a previously created and saved digital design file, or to save an in-progress or completed digital design file;

(b) an edit menu allowing said operational user to add or remove functional components and/or their connections according to specific design requirements, and if said function components and/or connections need to be duplicated or removed, said edit menu provides copy, paste and cut functions so as to modify existing design canvas configurations;

(c) an evaluation menu primarily associated with a check for errors in any of the combinations of said functional components and their connections; and (d) a generate derivatives menu for viewing digital copies of a plurality of end-product documents related to a specific design project or producing printed copies thereof.

13. The automated design system as in claim 12, wherein said plurality of end-product documents includes a bill materials, assembly drawings, wiring diagrams, work instructions, routings, and quality control instructions.

14. The automated design system as in claim 1, wherein said first output device comprises a standard printer being adapted for producing as output text-based documents, and wherein said second output device comprises a graphics plotting printer being adapted for producing as output graphical documents such as diagrams, schematics, drawings, and the like.

15. The automated design system as in claim 1, wherein said software program includes executable code written to enable said operational user to design said electromechanically controlled hydraulic system in a work session of less than one hour in duration.

16. The automated design system as in claim 1, wherein said software program includes executable code written to enable said operational user to design said electromechanically controlled hydraulic system in a single uninterrupted sitting.

17. An automated design system for facilitating intelligent design and coordinating the generation of design documentation for electromechanically controlled hydraulic systems, said automated design system comprising:

(a) a local server configured for providing access to operational application software as well as database information pertaining to the design characteristics of said electromechanically controlled hydraulic systems;

(b) a local processor configured in electronic communication with said local server, said local processor being configured for receiving said database information and executable aspects of said operational application software from said local server and said local processor being programmed to execute said executable aspects when prompted to do so by an operational user, retrieving said database information, as well as said executable aspects from said local server;

(c) a display device associated with said local processor for graphically displaying a plurality of design options correlating to a design canvas for the design of said electromechanically controlled hydraulic systems;

(d) a data input device associated with said local processor for accepting a plurality of design parameters related to the design options entered by said operational user;

(e) a pointing device associated with said local processor being configured to assist said operational user to input said plurality of design parameters;

(f) said operational application software being adapted to interface with said data input device to enable said operational user to select appropriate functional components of said electromechanically controlled hydraulic systems from a plurality of drop-down menus in a menu-based display, said menus being pre-programmed from templates standardized according to specific component characteristics, wherein upon selection by said operational user, each of said selected functional components is incorporated into a design of a particular electromechanically controlled hydraulic system; and (g) said operational application software being adapted to interface with a graphical user interface to graphically display the current progress in the design process by characteristically displaying said selected functional components, wherein said selected functional components are graphically linked and displayed on said design canvas.

* * * * *